US011973145B2

(12) United States Patent
Ramaswamy et al.

(10) Patent No.: US 11,973,145 B2
(45) Date of Patent: Apr. 30, 2024

(54) DEVICES INCLUDING VERTICAL TRANSISTORS, AND RELATED METHODS

(71) Applicant: Micron Technology, Inc., Boise, ID (US)

(72) Inventors: Durai Vishak Nirmal Ramaswamy, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/806,427

(22) Filed: Jun. 10, 2022

(65) Prior Publication Data

US 2022/0302318 A1 Sep. 22, 2022

Related U.S. Application Data

(63) Continuation of application No. 16/596,117, filed on Oct. 8, 2019, now Pat. No. 11,398,571.
(Continued)

(51) Int. Cl.
*H01L 29/786* (2006.01)
*H01L 21/02* (2006.01)
(Continued)

(52) U.S. Cl.
CPC .. *H01L 29/78642* (2013.01); *H01L 21/02172* (2013.01); *H01L 21/823412* (2013.01); *H01L 29/42392* (2013.01); *H01L 29/66969* (2013.01); *H01L 29/7869* (2013.01); *H01L 29/78696* (2013.01)

(58) Field of Classification Search
CPC .......... H01L 21/02172; H01L 21/0228; H01L 21/76885; H01L 21/823412; H01L 21/823437; H01L 29/42336; H01L 29/42392; H01L 29/66666; H01L 29/66969; H01L 29/732; H01L 29/78642;
(Continued)

(56) References Cited

U.S. PATENT DOCUMENTS 6,815,805 B2 11/2004 Weimer
8,299,516 B2 10/2012 Weng et al.
(Continued)

FOREIGN PATENT DOCUMENTS

DE 2820331 A1 11/1979
KR 10-2012-0092667 A 8/2012
(Continued)

OTHER PUBLICATIONS

Billah et al. TCAD Simulation of Dual-Gate a-IGZO TFTs With Source and Drain Offsets, IEEE Electron Device Letters, vol. 37, No. 11, (Nov. 2016), pp. 1442-1445.
(Continued)

*Primary Examiner* — Cheung Lee
(74) *Attorney, Agent, or Firm* — TraskBritt

(57) ABSTRACT

A device comprises vertically oriented transistors. The device comprises a pillar comprising at least one oxide semiconductor material, the pillar wider in a first lateral direction at an upper portion thereof than at a lower portion thereof, a gate dielectric material over sidewalls of the pillar and extending in the first lateral direction, and at least one gate electrode adjacent to at least a portion of the gate dielectric material. Related devices, electronic systems, and methods are also disclosed.

19 Claims, 16 Drawing Sheets

Related U.S. Application Data

(60) Provisional application No. 62/743,089, filed on Oct. 9, 2018.

(51) Int. Cl.
*H01L 21/8234* (2006.01)
*H01L 29/423* (2006.01)
*H01L 29/66* (2006.01)

(58) Field of Classification Search
CPC .......... H01L 29/7869; H01L 29/78696; H01L 2924/01031; H01L 2924/01049
See application file for complete search history.

(56) References Cited

U.S. PATENT DOCUMENTS

| | | | |
|---|---|---|---|
| 8,895,979 | B2 | 11/2014 | Chang et al. |
| 9,082,793 | B1 | 7/2015 | Ahmed |
| 9,246,013 | B2 | 1/2016 | Ahmed |
| 9,397,145 | B1 | 7/2016 | Sills et al. |
| 9,698,272 | B1 | 7/2017 | Ikeda et al. |
| 9,773,888 | B2 | 9/2017 | Pulugurtha et al. |
| 9,859,439 | B2 | 1/2018 | Miyairi |
| 9,917,138 | B1 | 3/2018 | Goki et al. |
| 2004/0097040 | A1 | 5/2004 | Kamins |
| 2011/0115011 | A1 | 5/2011 | Masuoka et al. |
| 2011/0287612 | A1 | 11/2011 | Lee et al. |
| 2012/0223313 | A1 | 9/2012 | Amano |
| 2013/0049120 | A1 | 2/2013 | Sandhu |
| 2013/0285051 | A1 | 10/2013 | Tanaka |
| 2015/0076495 | A1 | 3/2015 | Miyairi |
| 2015/0243748 | A1 | 8/2015 | Pulugurtha et al. |
| 2016/0027804 | A1 | 1/2016 | Li et al. |
| 2016/0079385 | A1 | 3/2016 | Ellinger et al. |
| 2016/0141416 | A1 | 5/2016 | Mariani et al. |
| 2016/0276454 | A1 | 9/2016 | Sandhu |
| 2017/0271375 | A1 | 9/2017 | Sasaki |
| 2018/0090679 | A1 | 3/2018 | Sills et al. |
| 2018/0114851 | A1 | 4/2018 | Balakrishnan et al. |

FOREIGN PATENT DOCUMENTS

| | | |
|---|---|---|
| WO | 2011/062041 A1 | 5/2011 |
| WO | 2018/063308 A1 | 4/2018 |

OTHER PUBLICATIONS

European Partial Search Report for European Application No. 19870693.9, dated Jun. 8, 2022, 13 pages.
International Search Report from International Application No. PCT/US2019/055230, dated Jan. 31, 2020, 3 pages.
International Written Opinion from International Application No. PCT/US2019/055230, dated Jan. 31, 2020, 6 pages.
Liu et al., Highly Flexible Electronics from Scalable Vertical Thin Film Transistors, Nano Letters, vol. 14, (2014), pp. 1413-1418.
Petti et al., Flexible Quasi-Vertical In—Ga—Zn—O Thin-Film Transistor With 300-nm Channel Length, vol. 36, No. 5, (May 2015), pp. 475-477.
Taiwanese Office Action for Application No. 108136503, dated Jul. 6, 2020, 21 pages.
Taiwanese Rejection Decision for Application No. 108136503, dated Mar. 18, 2021, 16 pages.
Yoon et al., Effects of Deposition Temperature on the Device Characteristics of Oxide Thin-Film Transistors Using In—Ga—Zn—O Active Channels Prepared by Atomic-Layer, Applied Materials interfaces, vol. 9, (2017), pp. 22676-22684.
Zheng et al., All-Sputtered, Flexible, Bottom-Gate IGZO/Al2O3 Bi-Layer Thin Film Transistors on PEN Fabricated by a Fully Room Temperature Process, Journals of Materials Chemistry C, vol. 5, (2017), pp. 7043-7050.
European Extended Search Report and Opinion for European Application No. 19870693.9, dated Sep. 9, 2022, 11 pages.
Korean Notice of Reasons for Rejection for Korean Application No. 10-2021-7013042, dated Sep. 19, 2022, 10 pages with English translation.

DEVICES INCLUDING VERTICAL TRANSISTORS, AND RELATED METHODS

CROSS-REFERENCE TO RELATED APPLICATIONS

This application is a continuation of U.S. patent application Ser. No. 16/596,117, filed Oct. 8, 2019, now U.S. Pat. No. 11,398,571, issued Jul. 26, 2022, which claims the benefit under 35 U.S.C. § 119(e) of U.S. Provisional Patent Application Ser. No. 62/743,089, filed Oct. 9, 2018, entitled "SEMICONDUCTOR DEVICES AND ELECTRONIC SYSTEMS INCLUDING VERTICAL TRANSISTORS, AND RELATED METHODS," the disclosure of each of which is hereby incorporated herein in its entirety by this reference.

TECHNICAL FIELD

Embodiments of the disclosure relate to the field of semiconductor device design and fabrication. More specifically, embodiments of the disclosure relate to methods of forming vertical transistors including oxide semiconductor channel regions, and to related semiconductor devices and electronic systems.

BACKGROUND

Fabrication of semiconductor devices including vertical transistors and vertical memory cells often includes stacking materials that will eventually form the vertical transistors including source and drain contacts, channel regions, and gate electrode materials one over another. The materials of the stack are then patterned to form pillars including the stack of materials.

The channel regions of the vertical transistors include a semiconductor material intended to conduct a current responsive to application of a threshold voltage and hinder the flow of current in the absence of the threshold voltage. Forming the pillars of the semiconductor material of the channel regions may include patterning the semiconductor material, such as by exposing the semiconductor material to one or more etch chemistries. However, exposing the semiconductor material to the one or more etch chemistries may negatively affect the electrical and material properties of the semiconductor material. For example, exposing the semiconductor material to etch chemistries, such as hydrogen-containing plasmas, may affect the electrical properties of the semiconductor material, affecting the flow of current through a channel material formed from the semiconductor material, and ultimately affecting performance of the associated transistor.

In addition, formation of the materials that form vertical transistors prior to patterning of individual vertical transistors may not be conducive to tailoring the electrical properties of the vertical transistors. For example, when the materials of the vertical transistor are stacked in a stack structure, it may be difficult to tailor the electrical properties of the channel region of the vertical transistors for optimum performance. Further, many conventional channel regions of vertical transistors exhibit a high off current ($I_{off}$) (i.e., a high off state leakage), low electron carrier mobility, and scattering at an interface between a gate oxide material and the channel region of the vertical transistor.

DETAILED DESCRIPTION

Figure 1A:
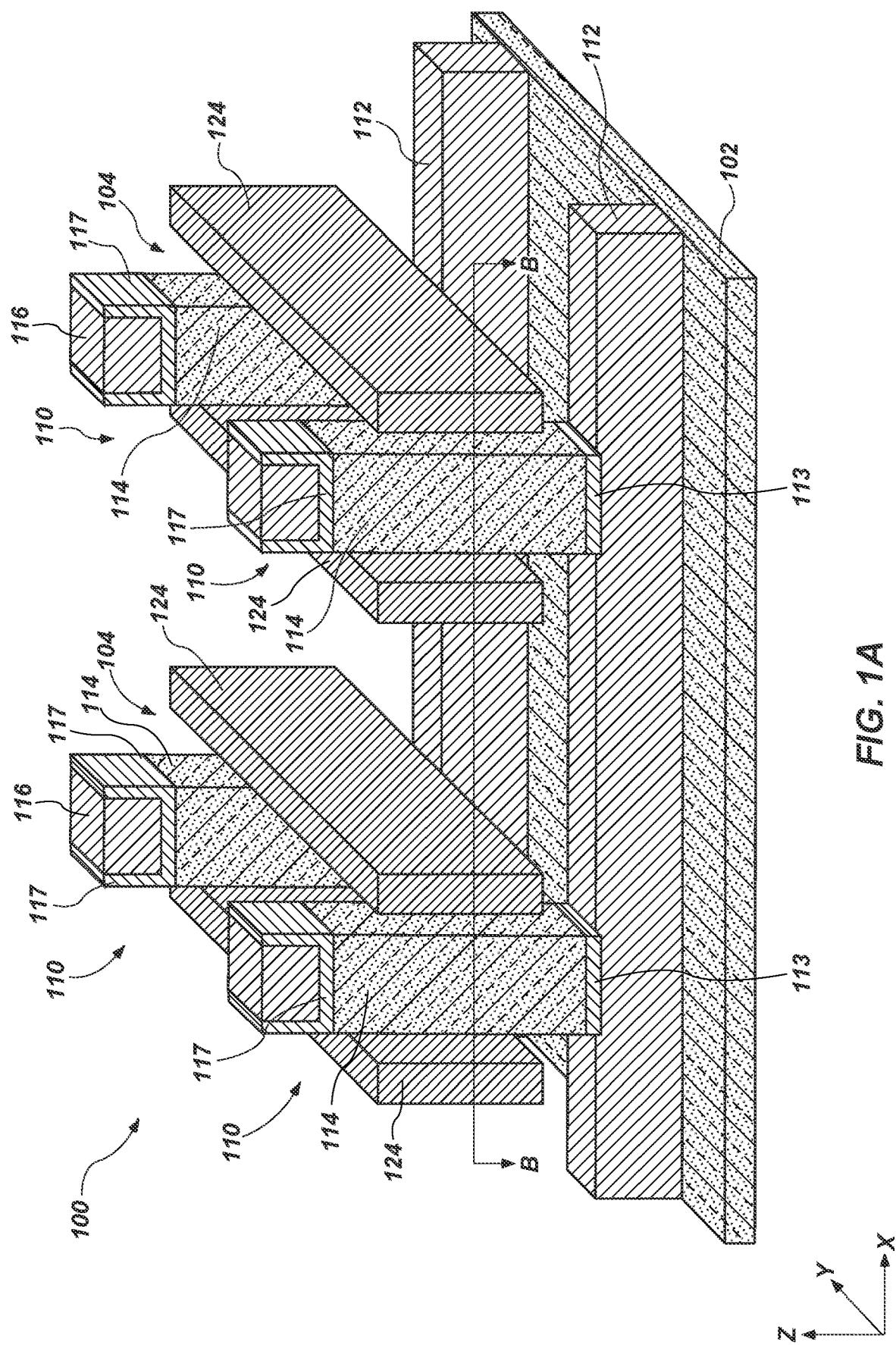
FIG. 1A through FIG. 1C are simplified partial perspective (FIG. 1A) and simplified partial cross-sectional (FIG. 1B and FIG. 1C) views of a semiconductor device including vertical transistors, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device including a vertical transistor comprising an oxide semiconductor channel region, a vertical transistor comprising an oxide semiconductor channel region, or a complete description of a process flow for fabricating such a semiconductor device or a vertical transistor. The structures described below do not form complete semiconductor devices. Only those process acts and structures necessary to understand the embodiments described herein are described in detail below. Additional acts to form a complete semiconductor device may be performed by conventional techniques.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

According to embodiments described herein, a vertical transistor may be fabricated with an oxide semiconductor material comprising the channel region of the vertical transistor. The channel region may be formed without substantially exposing the oxide semiconductor material to etch chemistries, such as through the use of a damascene (e.g., etch-free) process. Since the oxide semiconductor material is not substantially exposed to etch chemistries, the oxide semiconductor material may exhibit improved properties relative to channel regions of conventional transistors. For example, the oxide semiconductor material may exhibit higher electron carrier mobility than conventional oxide semiconductor materials. In addition, the vertical transistor including the oxide semiconductor material may exhibit a lower off current ($I_{off}$), a reduced off state leakage, and may exhibit a reduced amount of current leakage compared to conventional vertical transistors. In addition, the vertical transistor may exhibit an increased (i.e., a less negative) threshold voltage $V_t$. The oxide semiconductor material may be formed by atomic layer deposition (ALD) and may be formed as a composite structure, which may further facilitate formation of a transistor having a channel region exhibiting an increased electron carrier mobility, increased threshold voltage ($V_t$), a lower off current ($I_{off}$), and a reduced amount of corresponding off state leakage. The materials of the composite structure may be altered to tailor the electrical properties of the composite structure and of the associated vertical transistor.

Figure 1B:
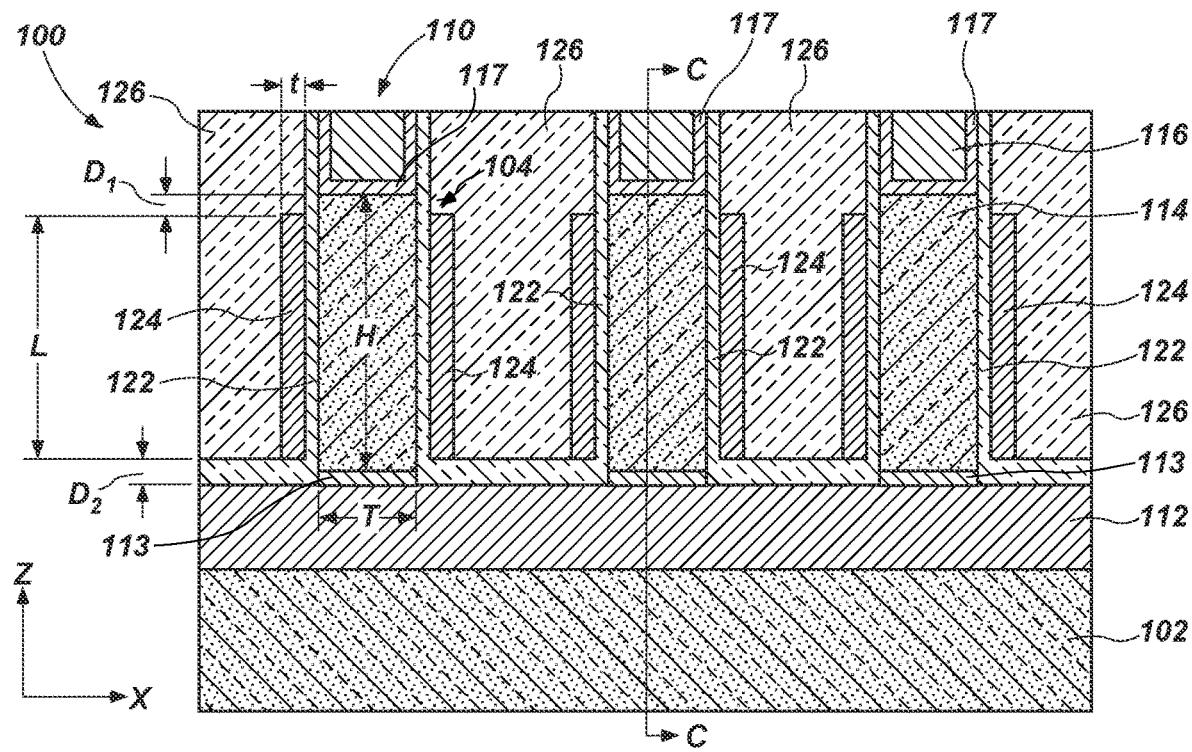
Figure 1C:
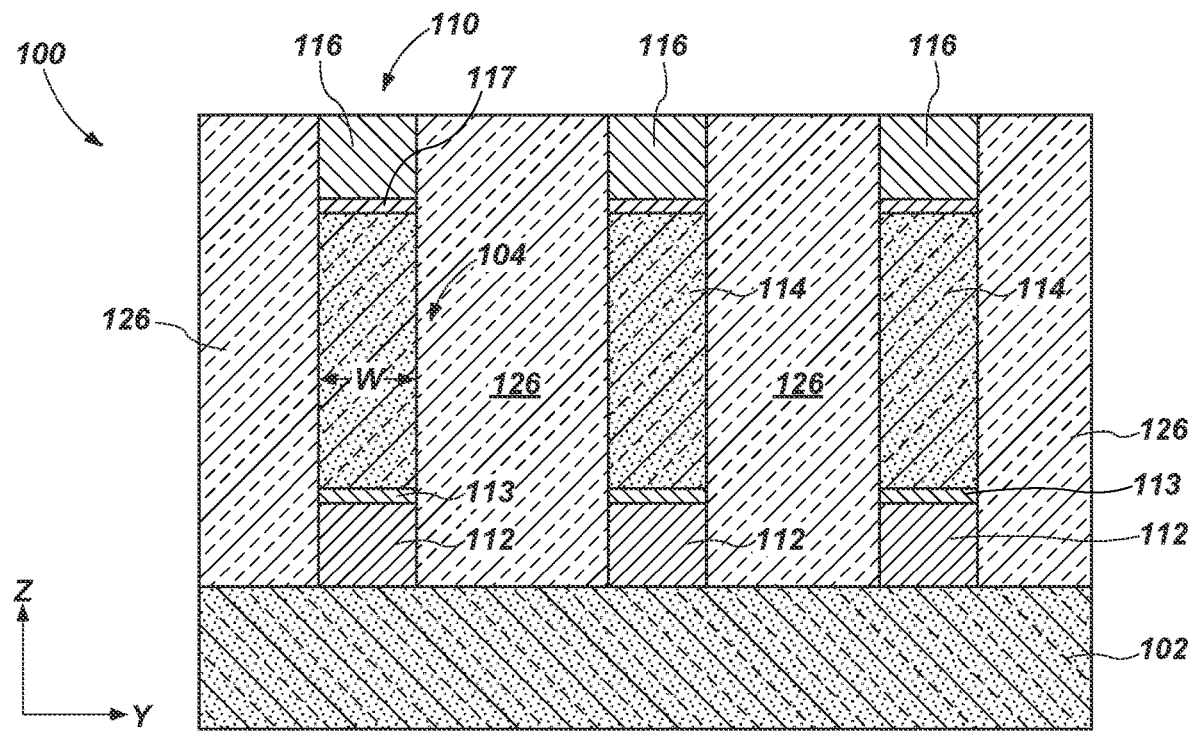

FIG. 1A is a simplified partial perspective view of a semiconductor device 100 including an array of vertical transistors 110, which may overlie a substrate 102. FIG. 1B is a simplified partial cross-sectional view of the semiconductor device 100 taken along section line B-B of FIG. 1A. FIG. 1C is a simplified partial cross-sectional view of the semiconductor device 100 taken along section line C-C of FIG. 1B. With collective reference to FIG. 1A through FIG. 1C, the vertical transistors 110 may include pillars arranged in rows extending in a first lateral direction (e.g., the x-direction shown in FIG. 1A through FIG. 1C) and columns extending in a second lateral direction (e.g., the y-direction shown in FIG. 1A through FIG. 1C) different from the first lateral direction. The second lateral direction may be perpendicular to the first lateral direction. In other embodiments, the rows of vertical transistors 110 and the columns of the vertical transistors 110 may not be perpendicular to each other. By way of nonlimiting example, the vertical transistors 110 may be arranged in a hexagonal close-packed orientation for increasing a density of the vertical transistors 110.

The array of vertical transistors 110 may include electrically conductive lines 112 extending over a substrate 102. The substrate 102 may be a base material or a construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

The electrically conductive lines 112 may include an electrically conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive lines 112 comprise tungsten. In additional embodiments, the electrically conductive lines 112 comprise ruthenium.

In some embodiments, the electrically conductive lines 112 comprise source lines of the semiconductor device 100. In additional embodiments, the electrically conductive lines 112 comprise digit lines (e.g., bit lines, data lines) of the semiconductor device 100. However, the disclosure is not so limited and the electrically conductive lines 112 may comprise a component or structure of the semiconductor device 100 other than those described above. The electrically conductive lines 112 may each extend in a first lateral direction (e.g., the x-direction).

The vertical transistors 110 also include pillars 104 over the electrically conductive lines 112. The pillars 104 may extend from an electrically conductive line 112 to an upper conductive contact 116. The upper conductive contact 116 of a vertical transistor 110 may be in electrical communication with, for example, an electrode (a bottom electrode) of a memory cell associated with the vertical transistor 110.

The upper conductive contact 116 may include any of the materials described above with reference to the electrically conductive lines 112. In some embodiments, the upper conductive contacts 116 include the same material as the electrically conductive lines 112. In other embodiments, the upper conductive contacts 116 include a different material than the electrically conductive lines 112. In some embodiments, the upper conductive contacts 116 comprise tungsten. In other embodiments, the upper conductive contacts 116 comprise ruthenium.

The vertical transistors 110 may include a lower conductive contact 113 in electrical communication with the electrically conductive lines 112. The lower conductive contact 113 may comprise, for example, one of a source contact and a drain contact. In some embodiments, the lower conductive contact 113 comprises a source contact. The lower conductive contact 113 may include an electrically conductive material. The upper conductive contact 116 may comprise, for example, one of a source contact or a drain contact (the lower conductive contact 113 comprising the other of the source contact or the drain contact). In some embodiments, the upper conductive contact 116 comprises the same material as the lower conductive contact 113. In addition, the vertical transistors 110 may include a conductive material 117 between the upper conductive contact 116 and the semiconductor material 114. However, the disclosure is not so limited and, in some embodiments, the upper conductive contact 116 directly overlies and contacts the semiconductor material 114.

With continued reference to FIG. 1A through FIG. 1C, the pillars 104 of the vertical transistors 110 may include a semiconductor material 114 disposed between the lower conductive contact 113 and the upper conductive contact 116. The semiconductor material 114 may comprise a channel region of the vertical transistors 110, as described in further detail below. The semiconductor material 114 is also referred to herein as a "channel region" or a "channel material."

Each of the vertical transistors 110 further includes a gate dielectric material 122 (FIG. 1B) extending adjacent to (e.g., overlying, over, on) sidewalls of at least a portion of the semiconductor material 114 thereof, and at least one gate electrode 124 (e.g., word line plate) adjacent to (e.g., overlying, over, on) at least a portion of the gate dielectric material 122. The gate dielectric material 122 is not illustrated in FIG. 1A for clarity, but it will be understood that the gate dielectric material 122 is located at least between the semiconductor material 114 and the gate electrode 124.

The gate dielectric material 122 may include one or more electrically insulative materials, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the gate dielectric material 122 comprises silicon dioxide.

The gate electrode 124 may include an electrically conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

In some embodiments, the gate electrode 124 extends along the vertical transistors 110 in the y-direction shown in FIG. 1A. Each gate electrode 124 may be associated with a particular row or a particular column of vertical transistors 110 in the array. In some embodiments, the gate electrode 124 extends in a direction substantially orthogonal to the direction in which the electrically conductive lines 112 extend.

A length L of the gate electrode 124 may be within a range of from about 30 nanometers (nm) to about 200 nm, such as from about 30 nm to about 50 nm, from about 50 nm to about 100 nm, or from about 100 nm to about 200 nm. In some embodiments, the length L of the gate electrode 124 is within a range of from about 60 nm to about 65 nm. A thickness t of the gate electrode 124 may be within a range of from about 5 nm to about 15 nm, such as from about 5 nm to about 10 nm, or from about 10 nm to about 15 nm. In some embodiments, the thickness t is about 6 nm.

The semiconductor material 114 may have a height H within a range of from about 30 nm to about 200 nm, such as from about 30 nm to about 50 nm, from about 50 nm to about 75 nm, from about 75 nm to about 100 nm, from about 100 nm to about 150 nm, or from about 150 nm to about 200 nm. In some embodiments, the height H of the semiconductor material 114 is within a range from about 50 nm to about 100 nm. In some embodiments, the semiconductor material 114 has a height H of about 70 nm. The semiconductor material 114 may have a width W (FIG. 1C) in the y-direction, along a length of the gate electrode 124 within a range of from about 20 nm to about 200 nm, such as from about 20 nm to about 50 nm, from about 50 nm to about 100 nm, from about 100 nm to about 150 nm, or from about 150 nm to about 200 nm. The semiconductor material 114 may have a thickness T (FIG. 1B) in the x-direction within a range of from about 10 nm to about 50 nm, such as from about 10 nm to about 20 nm, from about 20 nm to about 30 nm, or from about 30 nm to about 50 nm. In some embodiments, the thickness T is about 15 nm. Although specific ranges of the semiconductor material 114 and the gate electrode 124 have been described, the disclosure is not limited to such dimensions, and one or more of the dimensions of the semiconductor material 114 (e.g., one or more of the height H, the width W, and the thickness T), and/or one or more of the dimensions of the gate electrode 124 (e.g., one or more of the thickness t and the length L) may be different than those described above.

Referring to FIG. 1B, a distance (spacing) $D_1$ between the gate electrode 124 and the upper conductive contact 116 may be within a range of from about 0 nm to about 50 nm, such as from about 0 nm to about 5 nm, from about 5 nm to about 10 nm, from about 10 nm to about 20 nm, from about 20 nm to about 30 nm, or from about 30 nm to about 50 nm. In some embodiments, the distance $D_1$ is about 5 nm. A distance (spacing) $D_2$ between the gate electrode 124 and the electrically conductive lines 112 may be within a range of from about 0 nm to about 20 nm, such as from about 0 nm to about 5 nm, from about 5 nm to about 10 nm, or from about 10 nm to about 20 nm. In some embodiments, the distance $D_2$ is about 5 nm. The distance $D_2$ may be the same or may be different than the distance $D_1$. In some embodiments, a thickness of the gate dielectric material 122 corresponds to (e.g., is the same as) the distance $D_2$. The distances $D_1$, $D_2$ may be referred to as a so-called "gate-to-contact" spacing.

With reference to FIG. 1B and FIG. 1C, spaces between adjacent gate electrodes 124 of the semiconductor material 114 may include an electrically insulative material 126. The electrically insulative material 126 may comprise one or more electrically insulative materials, such as phosphosilicate glass, borosilicate glass, borophosphosilicate glass (BPSG), fluorosilicate glass, silicon dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the electrically insulative material 126 comprises a low-k dielectric material, such as, for example, silicon dioxide. In some embodiments, the electrically insulative material 126 comprises the same material as the gate dielectric material 122.

The semiconductor material 114 may comprise a material formulated to conduct current responsive to application of a suitable voltage (e.g., a gate voltage, a set bias voltage, a read bias voltage) to the vertical transistor 110. The semiconductor material 114 may comprise a semiconductive material having a larger bandgap than polycrystalline silicon, such as a bandgap greater than 1.65 electronvolts (eV). For example, the semiconductor material 114 may comprise an oxide semiconductor material, such as one or more of zinc tin oxide (ZTO; $Zn_xSn_yO_z$), indium zinc oxide (IZO; $In_xZn_yO_z$), zinc oxide ($ZnO_x$), indium gallium zinc oxide (IGZO; $In_xGa_yZn_zO_a$), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_wO_a$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), indium tungsten oxide (IWO; $In_xW_yO_z$), and other similar materials. In some embodiments, the semiconductor material 114 comprises IGZO. In some embodiments, the semiconductor material 114 may have an In:Ga:Zn:O ratio of 1:1:1:4; may have an $In_2O_3$:$Ga_2O_3$:ZnO ratio of 2:2:1, or may be represented by the formula $InGaO_3(ZnO)_5$. In additional embodiments, the semiconductor material 114 comprises IGZO and IGSO. The semiconductor material 114 may comprise a ternary oxide, including atoms of two different elements and as well as atoms of oxygen. In other embodiments, the semiconductor material 114 comprises a quaternary oxide including atoms of three different elements and atoms of oxygen. As will be described herein, in some embodiments, the semiconductor material 114 may include a composite structure including one or more discrete portions of one or more of the materials described above.

In some embodiments, gallium may constitute from about 20 atomic percent to about 60 atomic percent, such as from about 35 atomic percent to about 55 atomic percent, of the semiconductor material 114, based on the non-oxide elements (i.e., based on the other elements of the semiconductor material 114 (i.e., not including oxygen atoms)). Zinc may constitute from about 20 atomic percent to about 60 atomic percent, such as from about 20 atomic percent to about 40 atomic percent, of the semiconductor material 114, based on non-oxide elements of the semiconductor material 114. Indium may constitute from about 20 atomic percent to about 60 atomic percent, such as from about 20 atomic percent to about 40 atomic percent, of the semiconductor material 114, based on the non-oxide elements of the semiconductor material 114.

As will be described herein, the semiconductor material 114 may be formed through a damascene (e.g., a non-etch) process. In some such embodiments, the semiconductor material 114 is not substantially exposed to etch chemistries (e.g., wet etch chemistries; dry etch chemistries, such as plasma etch chemistries). Since the semiconductor material 114 may not be exposed to various etch chemistries, the semiconductor material may be said to be "pristine," or to comprise an "as-deposited" material. Accordingly, the semiconductor material 114 may exhibit improved electrical properties relative to conventional channel regions formed using one or more etching processes. In some embodiments, the semiconductor material 114 has increased electron carrier mobility compared to conventional channel region materials. Since the vertical transistors 110 are formed without etching the semiconductor material 114, the electrical properties of the semiconductor material 114 (and, hence, the vertical transistor 110) may be superior compared to conventional semiconductor materials 114, such as those that are exposed to various etch chemistries. For example, in some embodiments, the semiconductor material 114 has improved threshold voltage $V_t$ (an increased (less negative and more positive) $V_t$) and the vertical transistors 110 may exhibit a lower off current ($I_{off}$) and a reduced off state current compared to conventional vertical transistors.

Thus, in accordance with embodiments of the disclosure, a semiconductor device comprises a vertically oriented pillar over a conductive line, the vertically oriented pillar comprising an unetched oxide semiconductor material, a gate dielectric material adjacent to sides of the vertically oriented pillar, at least one gate electrode adjacent to the gate dielectric material, and a conductive contact over the vertically oriented pillar.

Figure 2A:
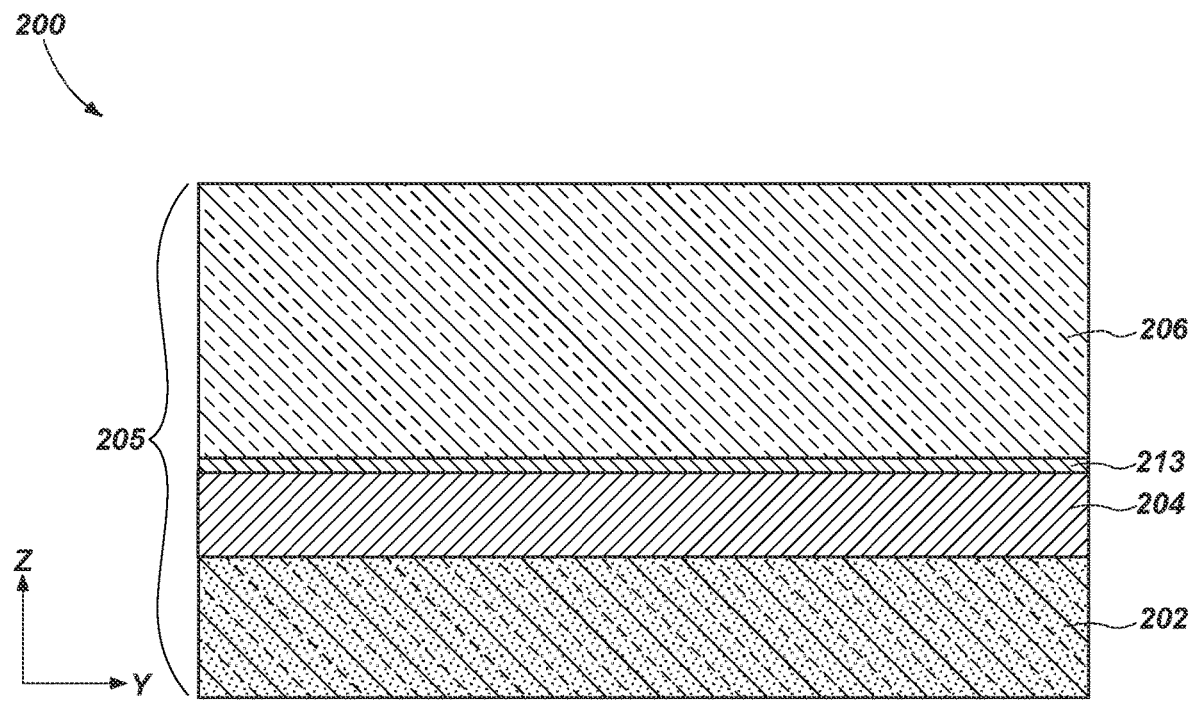
FIG. 2A through FIG. 2H are simplified partial cross-sectional views illustrating a method of forming the semiconductor device shown in FIG. 1A through FIG. 1C, in accordance with embodiments of the disclosure.

FIG. 2A through FIG. 2H are simplified partial cross-sectional views illustrating a method of fabricating the semiconductor device 100 shown in FIG. 1A through FIG. 1C, in accordance with embodiments of the disclosure. FIG. 2A is a simplified partial cross-sectional view of a semiconductor device 200 including a stack 205 of materials including a substrate 202, an electrically conductive material 204 over the substrate material 202, a lower conductive contact material 213 over the electrically conductive material 204, and a sacrificial material 206 over the lower conductive contact material 213. The substrate material 202, the electrically conductive material 204, and the lower conductive contact material 213 may include the same materials described above with reference to the substrate 102, the electrically conductive lines 112, and the lower conductive contact 113, respectively. Although FIG. 2A through FIG. 2H are described as including the lower conductive contact material 213, the disclosure is not so limited and the stack 205 may not include the lower conductive contact material 213. In some such embodiments, the sacrificial material 206 directly overlies and contacts the electrically conductive material 204.

Figure 2B:
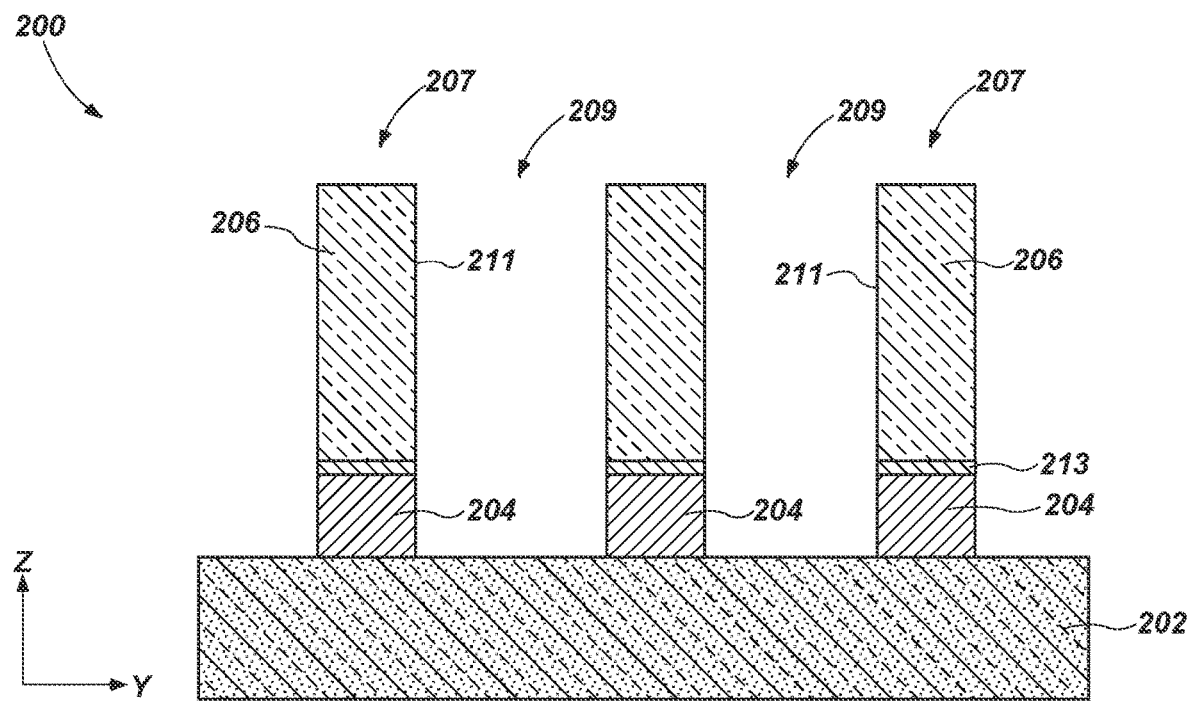

Referring to FIG. 2B, the stack 205 (FIG. 2A) may be patterned in a first direction to form lines 207 of the materials of the stack 205 extending in the first direction (e.g., the y-direction), the lines 207 separated by trenches 209. The trenches 209 may be formed through the sacrificial material 206 and the electrically conductive material 204 to form the lines 207 of the sacrificial material 206 and the electrically conductive material 204.

The sacrificial material 206 may be removed and patterned, such as by wet etching, dry etching, or a combination thereof. By way of nonlimiting example, the sacrificial material 206 may be patterned to form the trenches 209 by forming a mask over the stack 205, and exposing the sacrificial material 206 through the mask to one or more etch chemistries. In some embodiments, the sacrificial material 206 is patterned by dry etching. Suitable dry etchants may include, for example, plasmas including chlorine, carbon tetrafluoride ($CF_6$), trifluoromethane ($CHF_3$), hexafluoroethane ($C_2F_6$), sulfur hexafluoride ($SF_6$), another chemistry, or combinations thereof.

In some embodiments, patterning the sacrificial material 206 may include forming the trenches 209 to be defined by substantially vertical sidewalls 211. In some such embodiments, the sacrificial material 206 may be selected such that it may be patterned without forming substantially tapered (e.g., angled) sidewalls 211 with respect to the substrate 202. In some embodiments, the substantially vertical sidewalls 211 may extend at an angle of about 90° with respect to the substrate 202, such as from about 90° to about 89°, from about 89° to about 88°, or from about 88° to about 89°.

The sacrificial material 206 may include silicon (e.g., single crystalline silicon), polysilicon, silicon nitride, a carbon-containing material (e.g., SiOCN), carbon, a photoresist material, or another material. In some embodiments, the sacrificial material 206 comprises silicon.

Figure 2C:
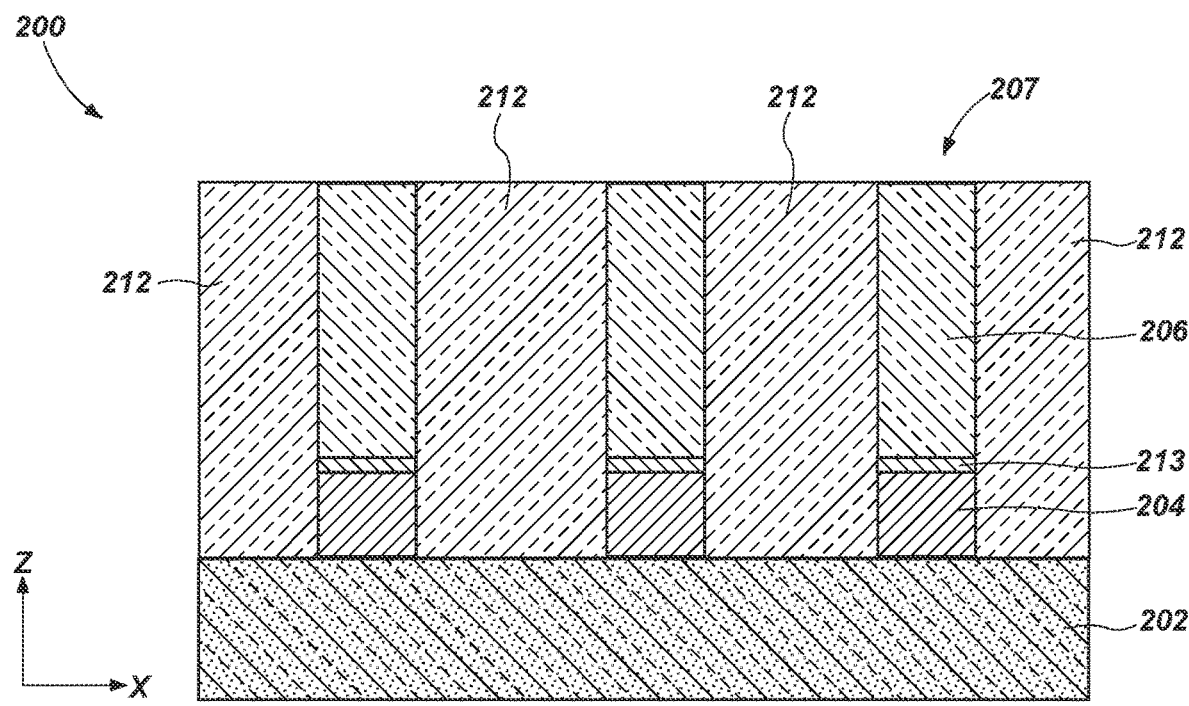

Referring to FIG. 2C, the trenches 209 (FIG. 2B) may be filled with an electrically insulative material 212. The electrically insulative material 212 may include, for example, a spin-on dielectric, phosphosilicate glass, borosilicate glass, borophosphosilicate glass (BPSG), fluorosilicate glass, silicon dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the electrically insulative material 212 comprises silicon dioxide.

Figure 2D:
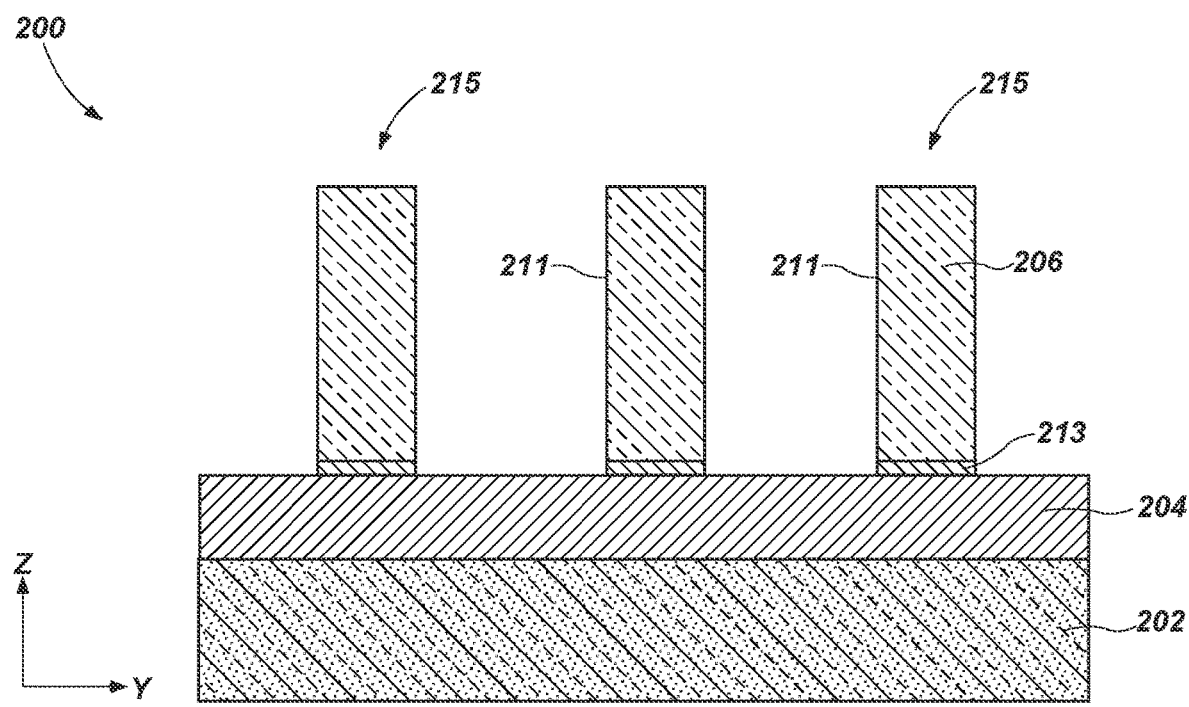

With reference to FIG. 2D, the semiconductor device 200 may be patterned in a second direction to form pillars 215 including the sacrificial material 206 and the lower conductive contact material 213. Forming the pillars 215 may include removing portions of the sacrificial material 206 of each of the lines 207 (FIG. 2B, FIG. 2C). In some embodiments, since the sacrificial material 206 comprises a material that may be patterned without forming substantially tapered sidewalls, the sidewalls of the pillars 215 are substantially vertical.

In some embodiments, during patterning of the semiconductor device 200 in the second direction, portions of the electrically conductive material 204 underlying the lines 207 (FIG. 2C) of the sacrificial material 206 are not to be removed such that the electrically conductive material 204 comprises lines of the electrically conductive material 204 extending in the y-direction. In some embodiments, the lower conductive contact material 213, if present, may form lines in the y-direction.

Figure 2E:
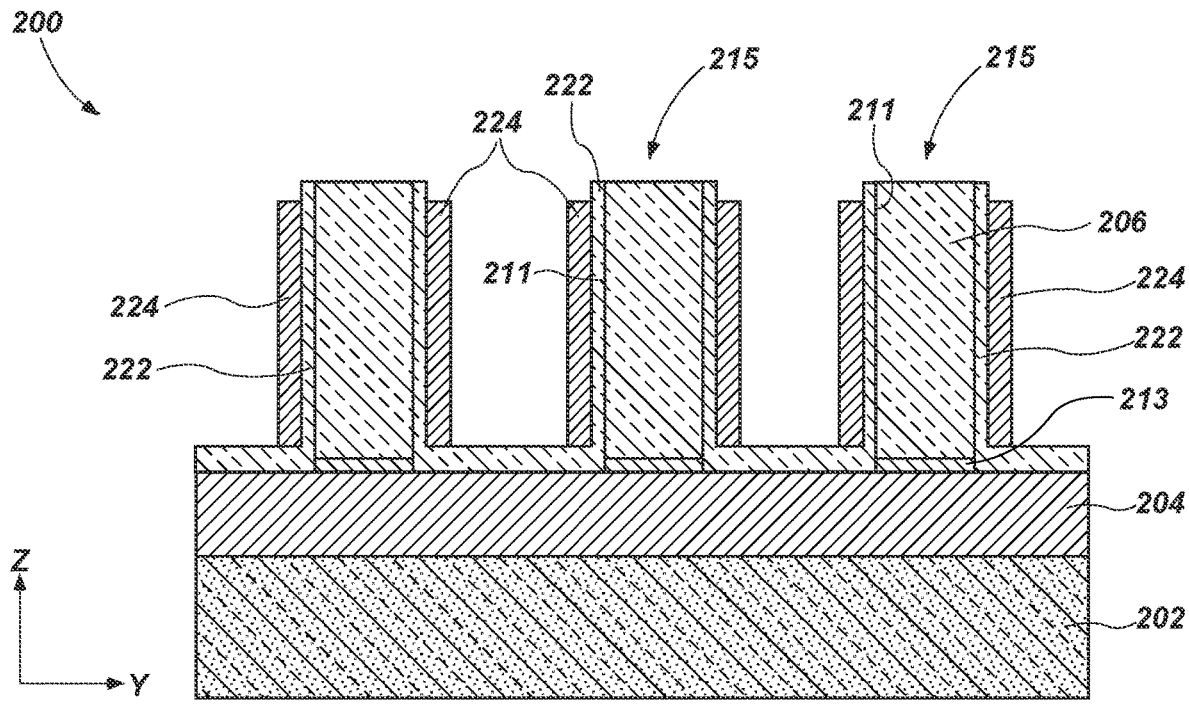

Referring to FIG. 2E, a gate dielectric material 222 may be formed over surfaces of the pillars 215. The gate dielectric material 222 may be formed adjacent to (e.g., over, on) at least sidewalls of the pillars 215. In some embodiments, the gate dielectric material 222 is formed on exposed surfaces of the electrically conductive material 204 between adjacent pillars 215. In some embodiments, the gate dielectric material 222 is conformally formed over the semiconductor device 200 and subsequently removed from upper surfaces of the sacrificial material 206, such as by way of a chemical mechanical planarization (CMP). The gate dielectric material 222 may include the same materials described above with reference to the gate dielectric material 122 (FIG. 1B).

After forming the gate dielectric material 222, a gate electrode material 224 may be formed adjacent to (e.g., over, on) at least a portion of the gate dielectric material 222. In some embodiments, the gate electrode material 224 may be formed over only a portion of the gate dielectric material 222 overlying sidewalls 211 of the pillars 215. In some embodiments, the gate electrode material 224 is conformally formed over the semiconductor device 200. The gate electrode material 224 may be removed from upper surfaces of the sacrificial material 206, such as by way of a CMP process and may be removed from lower portions of the gate dielectric material 222, such as with an anisotropic spacer etch. In other embodiments, the gate electrode material 224 is patterned such that an upper surface thereof is located below an upper surface of the sacrificial material 206. The gate electrode material 224 may include the same materials described above with reference to the gate electrode 124 (FIG. 1A, FIG. 1B).

Figure 2F:
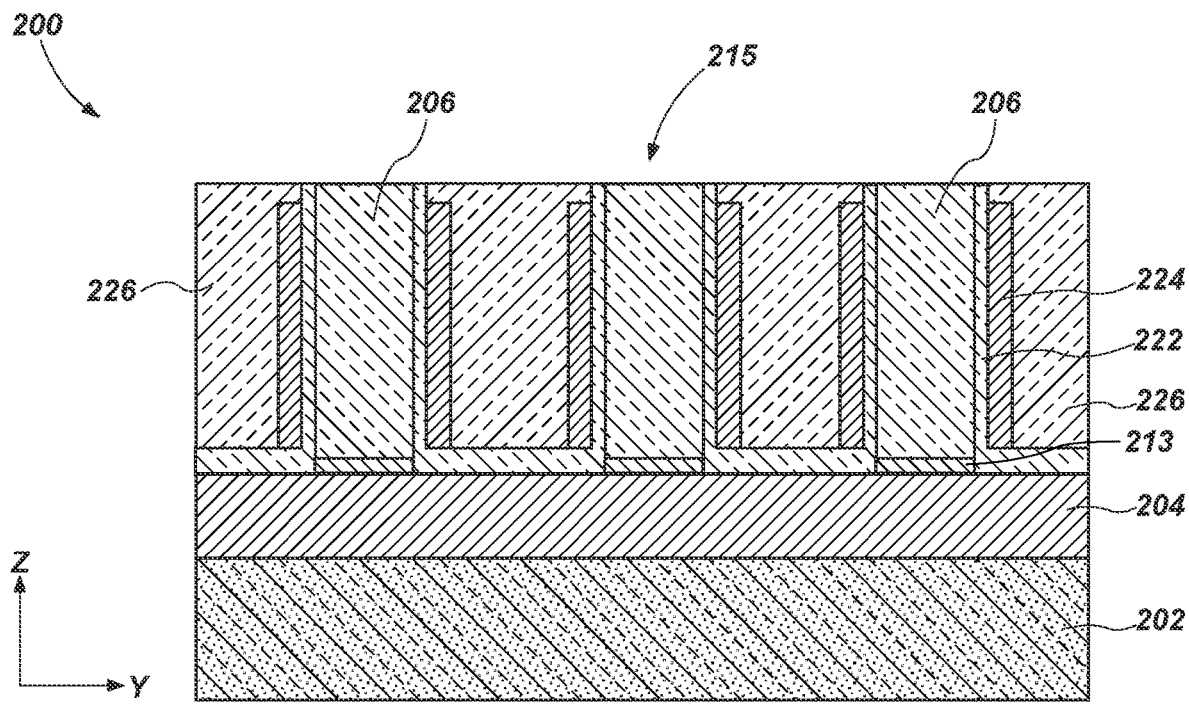

Referring to FIG. 2F, after forming and patterning the gate electrode material 224, an electrically insulative material 226 may be disposed in spaces between adjacent pillars 215. The electrically insulative material 226 may comprise the same materials described above with reference to the electrically insulative material 126 (FIG. 1B). In some embodiments, the electrically insulative material 226 comprises the same material as the gate dielectric material 222.

The electrically insulative material 226 may be planarized such than an upper exposed surface of the electrically insulative material 226 is substantially coplanar with an upper exposed surface of the pillars 215. In some embodiments, the electrically insulative material 226 overlying the pillars 215 may be removed by way of a CMP process.

Figure 2G:
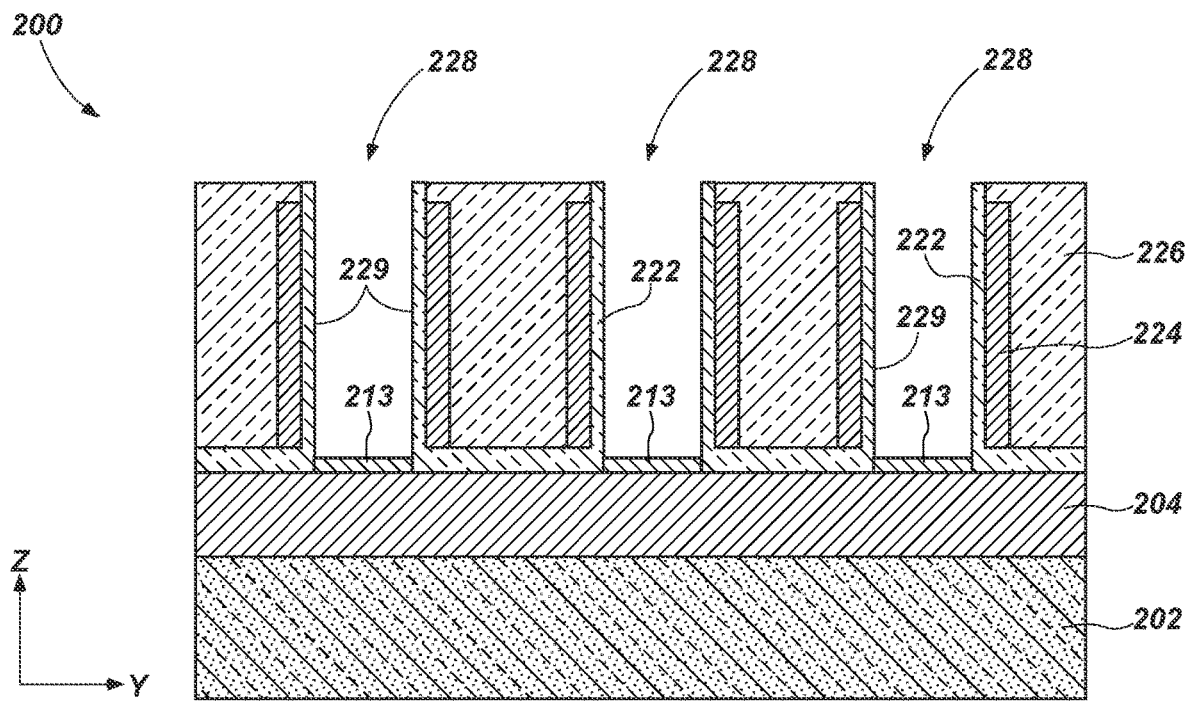

With reference to FIG. 2G, the pillars 215 of the sacrificial material 206 may be selectively removed to form openings 228 in the electrically insulative material 226 and to expose the lower conductive contact material 213 within the openings 228, or the electrically conductive material 204 in embodiments not including the lower conductive contact material 213. The sacrificial material 206 may be removed by exposing the semiconductor device 200 to an etch chemistry that is selective to the sacrificial material 206 so as to not substantially remove the electrically insulative material 226 and the conductive contact material 213. In some embodiments, the sacrificial material 206 is removed by exposing the sacrificial material 206 to a wet etch chemistry, a dry etch chemistry, or combinations thereof. In some embodiments, the sacrificial material 206 is exposed to a plasma including hydrogen. The openings 228 may be defined by substantially vertical sidewalls 229.

Figure 2H:
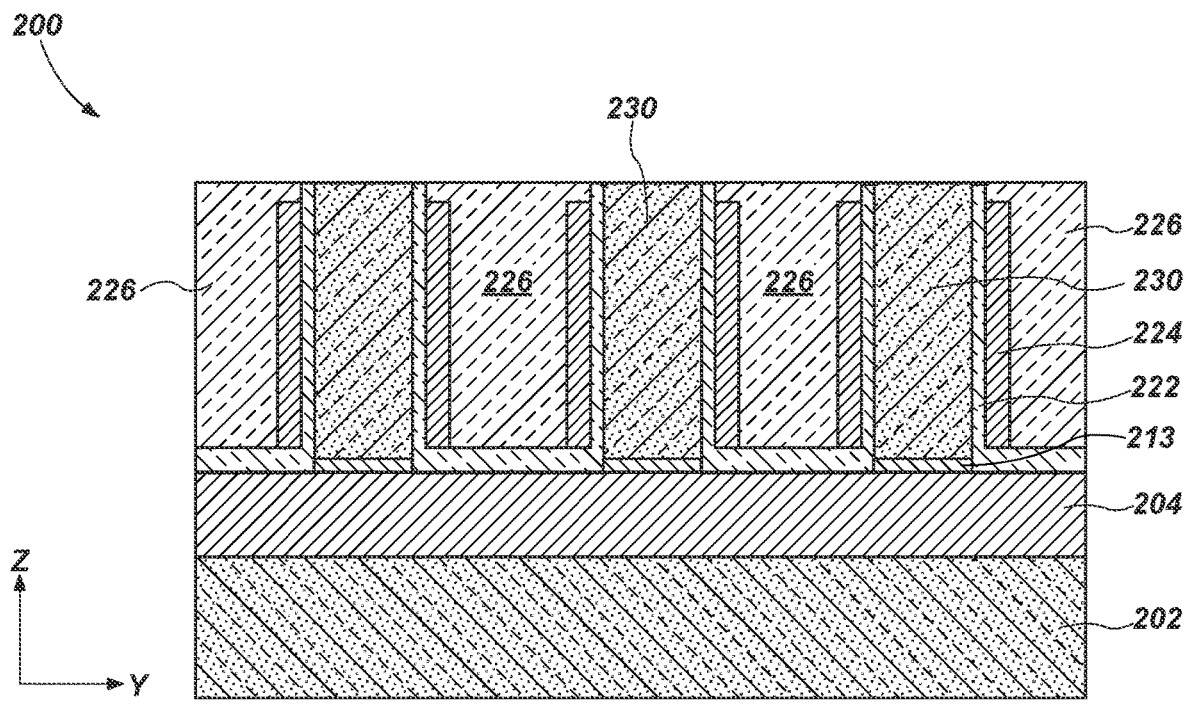

Referring to FIG. 2H, the openings 228 (FIG. 2G) may be filled with a semiconductor material 230. The semiconductor material 230 may be substantially the same as the semiconductor material 114 described above with reference to FIG. 1A through FIG. 1C. For example, the semiconductor material 230 may include zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), indium tungsten oxide (IWO), and other similar materials. In some embodiments, the semiconductor material 230 comprises a composite structure including one or more discrete portions of one or more of the materials described above.

With continued reference to FIG. 2H, portions of the semiconductor material 230 overlying upper surfaces of the electrically insulative material 226 may be removed, such as by way of a CMP process. In some embodiments, an upper exposed surface of the semiconductor material 230 may be substantially coplanar with an upper exposed surface of the electrically insulative material 226.

In some embodiments, the semiconductor material 230 may be formed by atomic layer deposition (ALD). Forming the semiconductor material 230 by atomic layer deposition may substantially fill the opening 228 (FIG. 2G) with the semiconductor material 230 without forming substantial openings or voids within the volume defined by the openings 228 and filled with the semiconductor material 230. In some embodiments, the semiconductor material 230 may be substantially continuous and may not include any substantial voids. In other embodiments, the semiconductor material 230 may include at least some voids (e.g., air gaps or pockets, such as a tear drop structure) in the opening 228 (FIG. 2G).

Since the sacrificial material 206 (FIG. 2F) is formed of a material permitting the trenches 209 (FIG. 2B) between the pillars 215 (FIG. 2D) to exhibit substantially vertical sidewalls 211, the openings 228 (FIG. 2G) may also exhibit substantially vertical sidewalls 229. In some embodiments, the sidewalls 229 (FIG. 2G) may be substantially perpendicular (e.g., extend at an angle of about 90°) relative to the major surface of the substrate 202. Stated another way, the sidewalls 229 may not exhibit a substantial taper. By way of contrast, some oxide semiconductor materials are not currently capable of being etched at such an angle. Accordingly, it may be difficult to pattern oxide semiconductor materials without forming tapered sidewalls. In contrast, the method described herein forms the semiconductor material 230 within preformed openings having substantially vertical sidewalls 211, 229.

In some embodiments, the sidewalls 229 have an angle within a range of from about 80° to about 90° with reference to the major surface of the substrate 202, such as from about 80° to about 85°, from about 85° to about 87°, from about 87° to about 88°, from about 88° to about 89°, or from about 89° to about 90°.

Since the sidewalls 211, 229 are substantially vertical in some embodiments, the semiconductor material 230 may not exhibit so-called "pinch-off," wherein an airgap is formed within the semiconductor material 230 during formation thereof. By way of comparison, where the sidewalls 211, 229 are not substantially vertical and a top portion of the opening 228 exhibits a smaller cross-sectional area than a bottom portion thereof, the semiconductor material 230 may be formed with an air gap. Stated another way, as the semiconductor material 230 fills the opening 228, the cross-sectional area of the top portion of the opening 228 pinches off (i.e., closes) prior to filling the entire volume defined by the opening 228, leaving a gap defined within the semiconductor material 230 in the opening 228.

Since the openings 228 are filled with the semiconductor material 230 and the semiconductor material 230 is not patterned with an etch chemistry, the semiconductor material 230 may be a so-called "pristine" material, meaning that the semiconductor material 230 may not be exposed to etch chemistries, such as hydrogen-based plasma etch chemistries. In other words, the semiconductor material 230 in a final vertical transistor structure (e.g., the vertical transistors 110 shown in FIG. 1A through FIG. 1C) may comprise as-deposited materials. As described above, in some such embodiments, the semiconductor material 230 may exhibit improved properties relative to conventional semiconductor materials used as channel regions of transistor structures.

After forming the semiconductor material 230, an upper conductive contact material (e.g., the upper conductive contact 116 (FIG. 1B, FIG. 1C)) may be formed in electrical communication with the semiconductor material 230. For example, in some embodiments, the semiconductor material 230 may be recessed relative to the electrically insulative material 226, such as by exposing the semiconductor material 230 to a reactive ion etch or an anisotropic spacer etch to form recessed portions. The upper conductive contact material may be formed in the recessed portions to form the upper conductive contacts. In some embodiments, as described with reference to FIG. 3A and FIG. 3B, a channel contact may be formed conformally within the recessed portions and over the semiconductor material 230 prior to forming the upper conductive contact material. After forming the upper conductive contact material in the recessed portions, the semiconductor device may be planarized, such as by CMP, to form a semiconductor device as described above with reference to FIG. 1A through FIG. 1C. In other embodiments, the upper conductive contact material may be formed using, for example, a mask, which may be removed after the upper conductive contact material is formed. Spaces between the upper conductive contacts may be filled with a dielectric material and the semiconductor device may be planarized, such as by CMP.

Although the semiconductor devices 100, 200 have been described and illustrated herein as including vertical transistors 110 comprising so-called dual gate transistors (e.g., including two gate electrodes 124), the disclosure is not so limited. In other embodiments, the vertical transistors 110 may each include a single gate electrode (e.g., only one)

disposed around at least a portion of the semiconductor material 114 such that the vertical transistors 110 comprise so-called single-gate transistors. In other embodiments, the vertical transistors 110 may include a gate electrode disposed around substantially all sides of the vertical transistors 110 to form so-called gate-all-around vertical transistors.

Figure 3A:
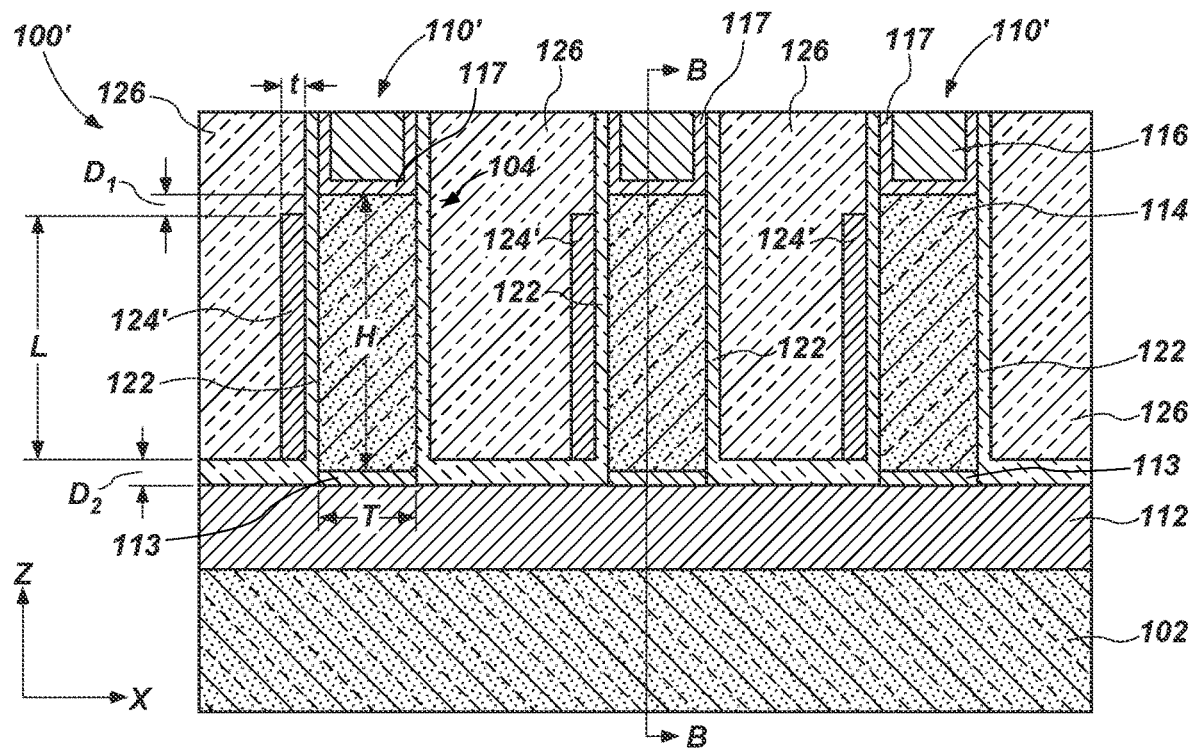
FIG. 3A and FIG. 3B are simplified partial cross-sectional views of a semiconductor device, in accordance with other embodiments of the disclosure.
Figure 3B:
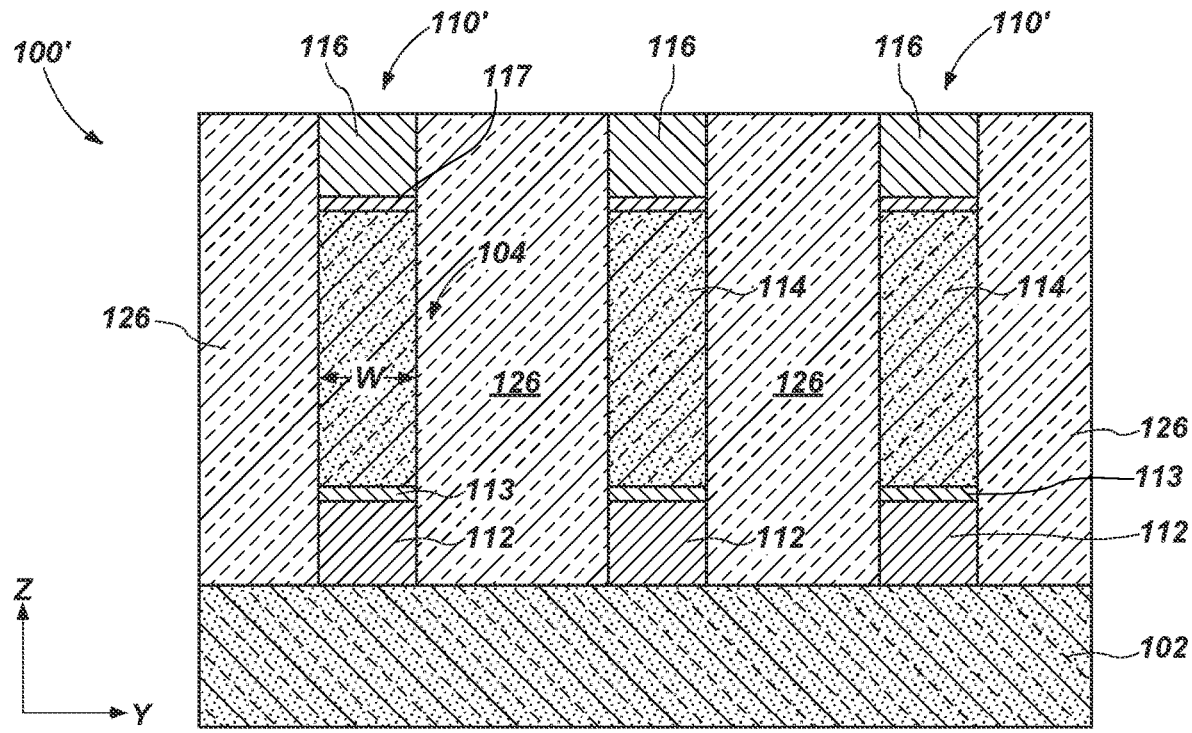

FIG. 3A is a simplified partial cross-sectional view of a semiconductor device 100' including vertical transistors 110' comprising single gate vertical transistors. FIG. 3B is a simplified partial cross-sectional view of the semiconductor device 100' taken along section line B-B of FIG. 3A. The semiconductor device 100' may be substantially the same as the semiconductor device 100 described above with reference to FIG. 1A through FIG. 1C, except that the semiconductor device 100' includes vertical transistors 110' each individually having a single (e.g., only one) gate electrode 124'. Formation of the semiconductor device 100' may be substantially similar to formation of the semiconductor device 200 described above with reference to FIG. 2A through FIG. 2H, except that when the gate electrodes 124 are formed, a portion of the pillars 215 may be masked such that a single gate electrode 124' is formed on only one side of the semiconductor device 100'.

Figure 4A:
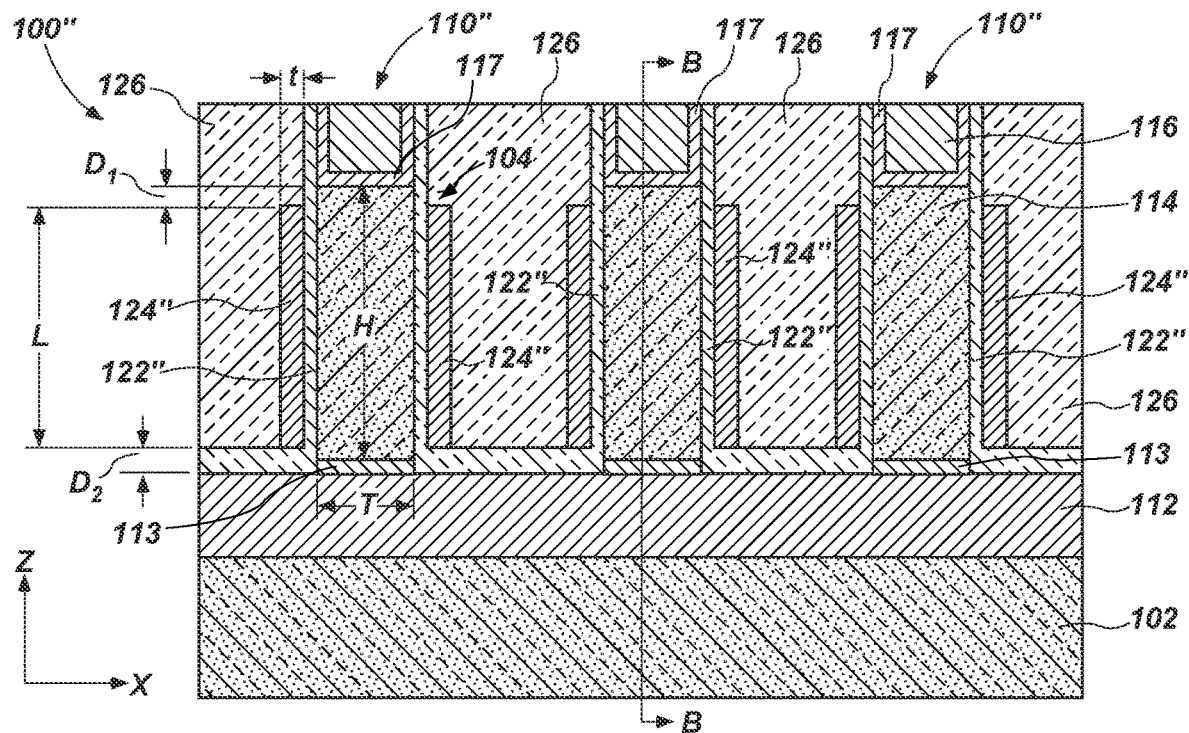
FIG. 4A and FIG. 4B are simplified partial cross-sectional views of a semiconductor device, in accordance with embodiments of the disclosure.
Figure 4B:
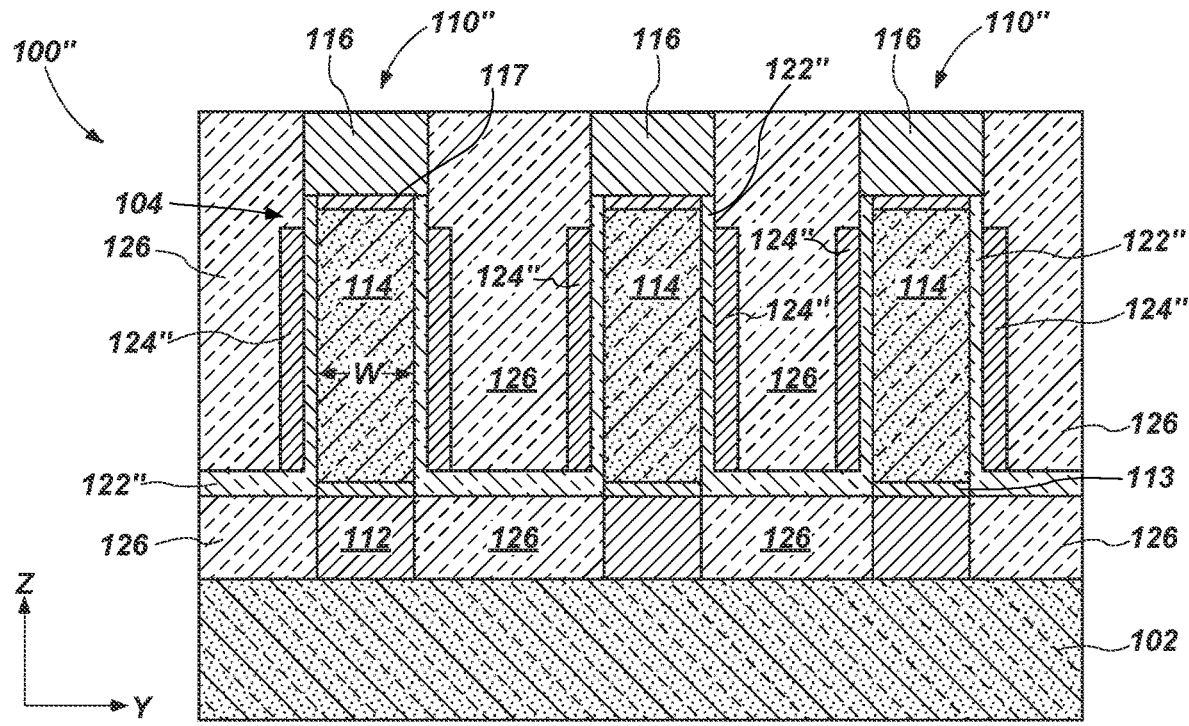

FIG. 4A is a simplified partial cross-sectional view of a semiconductor device 100" comprising so-called gate-all-around vertical transistors 110". FIG. 4B is a simplified partial cross-sectional view of the semiconductor device 100" taken along section line B-B of FIG. 4A. The semiconductor device 100" may be substantially similar to the semiconductor device 100 described above with reference to FIG. 1A through FIG. 1C, except that the vertical transistors 110" may include a gate dielectric material 122" disposed around substantially all sides of the semiconductor material 114, and a gate electrode 124" disposed around at least a portion of the gate dielectric material 122" on substantially all sides of the semiconductor material 114. In some embodiments, the semiconductor device 100" is formed in a similar manner as the semiconductor device 200 described above with reference to FIG. 2A through FIG. 2H, except that after forming the trenches 209 (FIG. 2B), the trenches 209 are not filled with an electrically insulative material 212 (FIG. 2C). Rather, after forming the trenches 209, the semiconductor device 100" may be patterned to form the pillars 215 (FIG. 2D) and the gate dielectric material 122" may be formed on substantially all sidewalls of the sacrificial material 206 such that the gate electrode 124" overlies substantially all sidewalls (e.g., side surfaces, lateral surfaces) of the sacrificial material 206. The gate electrode 124" may be formed over the gate dielectric material 122" and may surround (e.g., envelope, circumscribe) substantially all sidewalls (e.g., side surfaces, lateral surfaces) of the sacrificial material 206. Therefore, after the sacrificial material 206 is replaced with the semiconductor material 114, the gate electrode 124" may surround substantially all sidewalls (e.g., side surfaces, lateral surfaces) of the semiconductor material 114.

Therefore, in accordance with embodiments of the disclosure, a method of forming a semiconductor device comprises forming pillars over an electrically conductive material, each of the pillars comprising a sacrificial material vertically extending orthogonal to the electrically conductive material, forming a gate dielectric material adjacent to sidewalls of the pillars, forming a gate electrode material adjacent to the gate oxide material, removing the pillars to form openings, and forming an oxide semiconductor material within the openings.

Figure 5A:
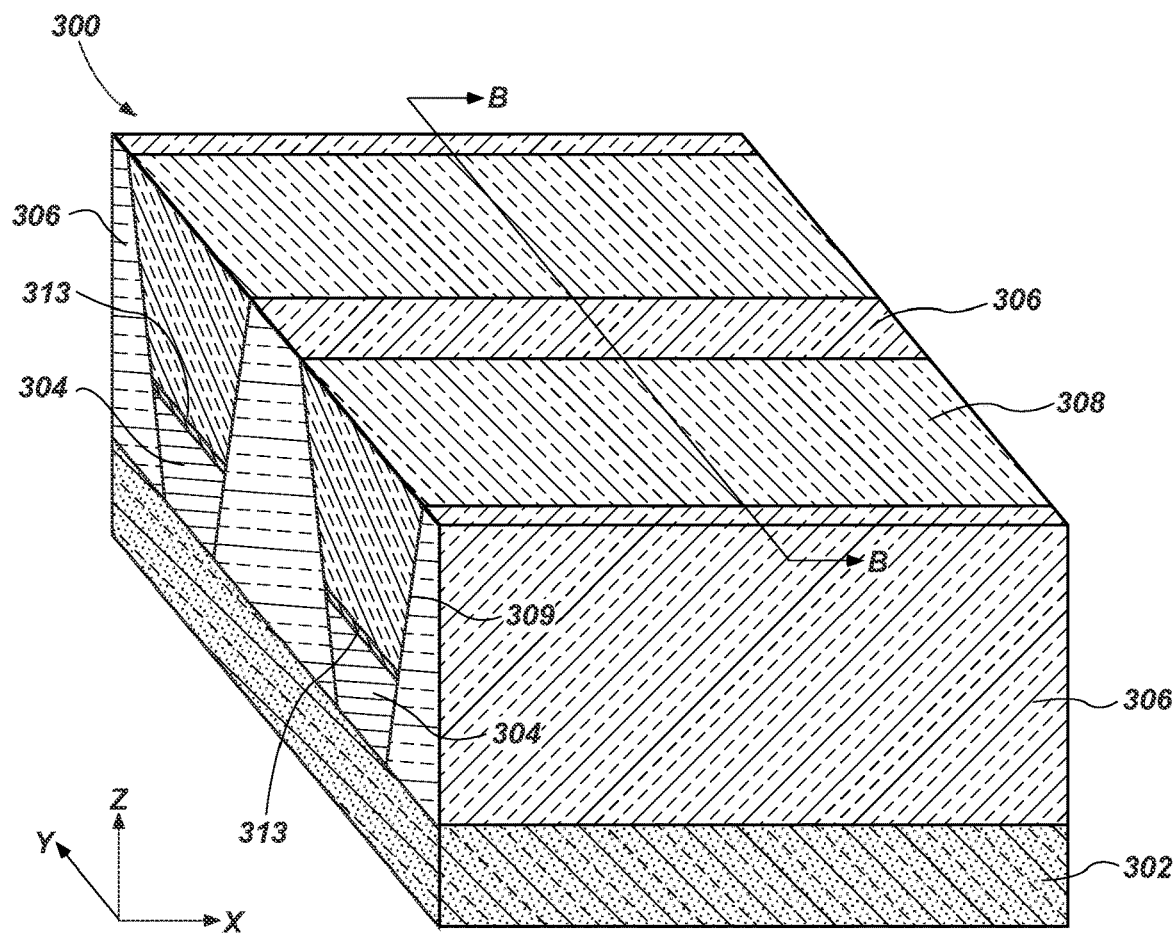
FIG. 5A through FIG. 5L are simplified partial perspective (FIG. 5A, FIG. 5C, FIG. 5E, FIG. 5G, and FIG. 5H) and simplified partial cross-sectional (FIG. 5B, FIG. 5D, FIG. 5F, FIG. 5I, FIG. 5J, FIG. 5K, and FIG. 5L) views illustrating a method for forming a semiconductor device, in accordance with other embodiments of the disclosure.
Figure 5B:
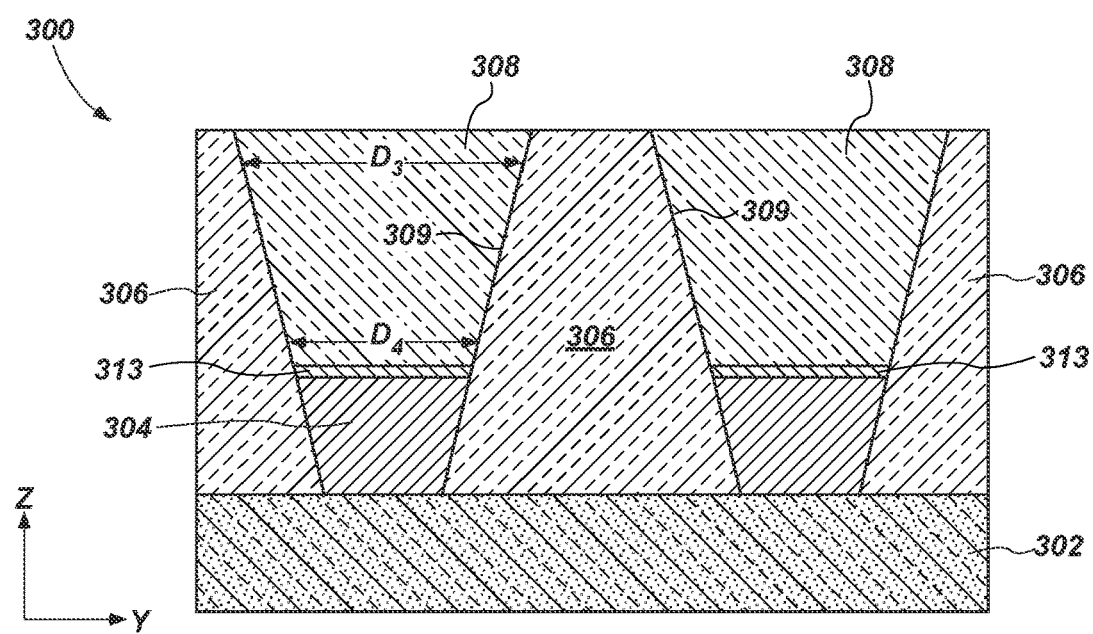

FIG. 5A through FIG. 5L are simplified partial perspective (FIG. 5A, FIG. 5C, FIG. 5E, FIG. 5G, FIG. 5H) and simplified partial cross-sectional (FIG. 5B, FIG. 5D, FIG. 5F, FIG. 5I, FIG. 5J, FIG. 5K, FIG. 5L) views illustrating a method of forming a semiconductor device, in accordance with other embodiments of the disclosure. FIG. 5A is a simplified partial perspective view of a semiconductor device 300, and FIG. 5B is a simplified partial cross-sectional view of the semiconductor device 300 taken along section line B-B of FIG. 5A. With collective reference to FIG. 5A and FIG. 5B, the semiconductor device 300 may include an electrically conductive material 304 extending in a first lateral direction (e.g., the x-direction) located within trenches defined in an electrically insulative material 306. The electrically conductive material 304 may comprise electrically conductive lines extending in the first direction.

A lower conductive contact material 313 may overlie the electrically conductive material 304 and a sacrificial material 308 may overlie the lower conductive contact material 313 within the trenches. The lower conductive contact material 313 may be substantially the same as the lower conductive contact 113 described above with reference to FIG. 1A through FIG. 1C. In other embodiments, the semiconductor device 300 may not include the lower conductive contact material 313 and the sacrificial material 308 may directly overlie and contact the electrically conductive material 304.

The sacrificial material 308 may be substantially the same as the sacrificial material 206 described above with reference to FIG. 2A through FIG. 2F. The sacrificial material 308 may exhibit an etch selectivity relative to the electrically insulative material 306. In some embodiments, the sacrificial material 308 comprises silicon. In other embodiments, the sacrificial material 308 comprises carbon or a carbon-containing material (e.g., SiOCN). In yet other embodiments, the sacrificial material 308 may include polysilicon, a nitride material (e.g., silicon nitride), a photoresist material, another material, or combinations thereof.

The electrically insulative material 306 may be substantially the same as the electrically insulative material 126 described above with reference to FIG. 1B and FIG. 1C. In some embodiments, the electrically insulative material 306 comprises silicon dioxide.

The substrate 302 may be substantially the same as the substrate 102 described above with reference to FIG. 1A through FIG. 1C. The electrically conductive material 304 may be substantially the same as the electrically conductive lines 112 described above with reference to FIG. 1A through FIG. 1C. In some embodiments, the electrically conductive material 304 comprises tungsten. In other embodiments, the electrically conductive material 304 comprises ruthenium.

Forming the semiconductor device 300 illustrated in FIG. 5A and FIG. 5B may include forming the electrically insulative material 306 over the substrate 302, and forming trenches extending in a first lateral direction (e.g., the x-direction) in the electrically insulative material 306. Forming the trenches may include exposing the electrically insulative material 306 to a wet etch chemistry, a dry etch chemistry, or a combination thereof. In some embodiments, as a result of the etching process, the trenches exhibit tapered sidewalls 309. As shown in FIG. 5B, the tapered sidewalls 309 may define at least a portion of the sacrificial material 308 such that a distance $D_3$ between opposing tapered sidewalls 309 at an upper portion of the sacrificial material 308 is larger than a distance $D_4$ between opposing tapered sidewalls 309 at a lower portion of the sacrificial material 308.

The tapered sidewalls 309 may extend from the substrate 302 at an angle other than substantially perpendicular. The tapered sidewalls 309 may be angled with respect to a plane perpendicular to the major surface of the substrate 302. The angle may be within a range from about 0° to about 20°, such as from about 0° to about 2°, from about 2° to about 50, from about 50 to about 10°, from about 10° to about 15°, or from about 15° to about 20°.

After forming the trenches in the electrically insulative material 306, at least a portion of the trenches may be filled with the electrically conductive material 304, and the lower conductive contact material 313 may be formed over the electrically conductive material 304. A remaining portion of the trenches may then be filled with the sacrificial material 308. The sacrificial material 308 may be planarized (e.g., by way of a CMP process), such that an upper surface of the sacrificial material 308 is substantially coplanar with an upper surface of the electrically insulative material 306.

Figure 5C:
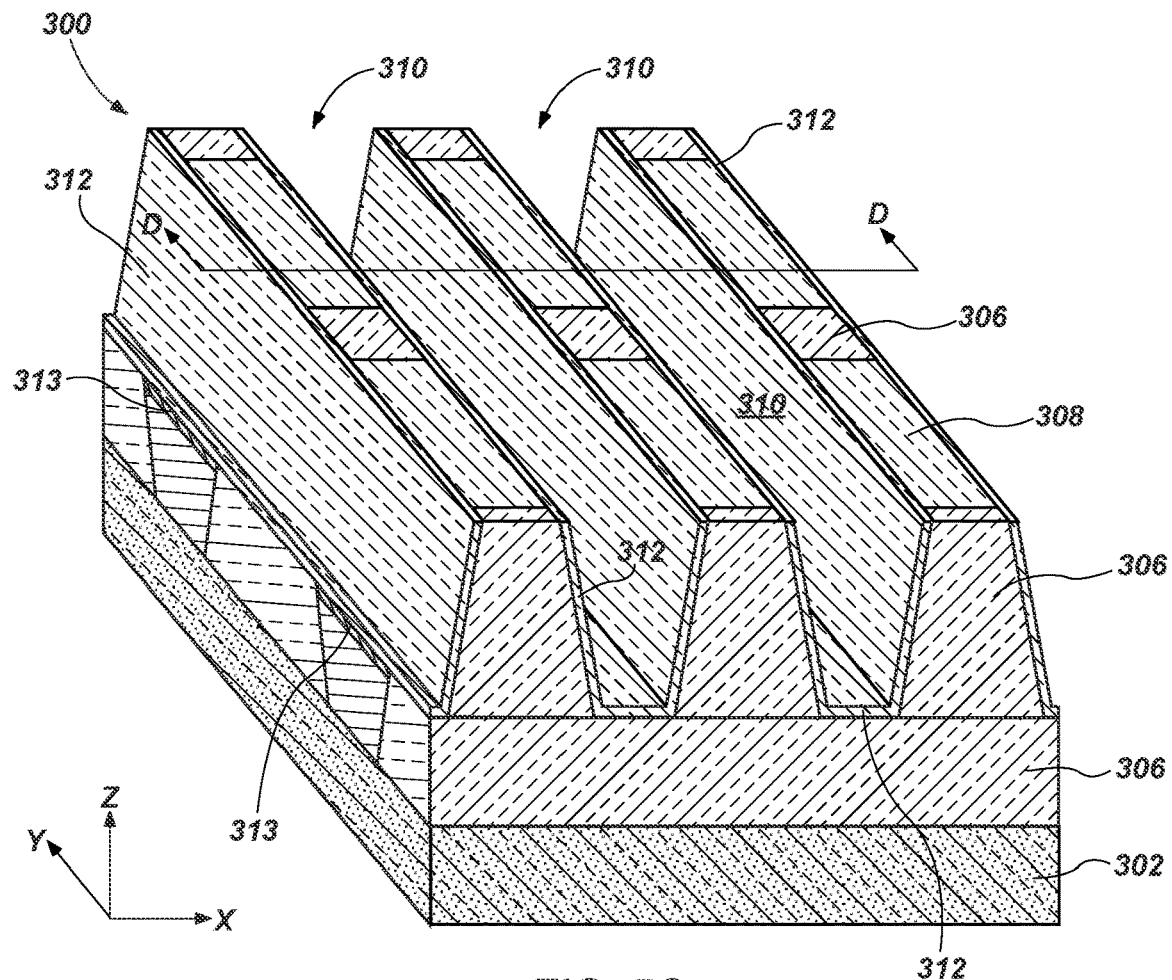
Figure 5D:
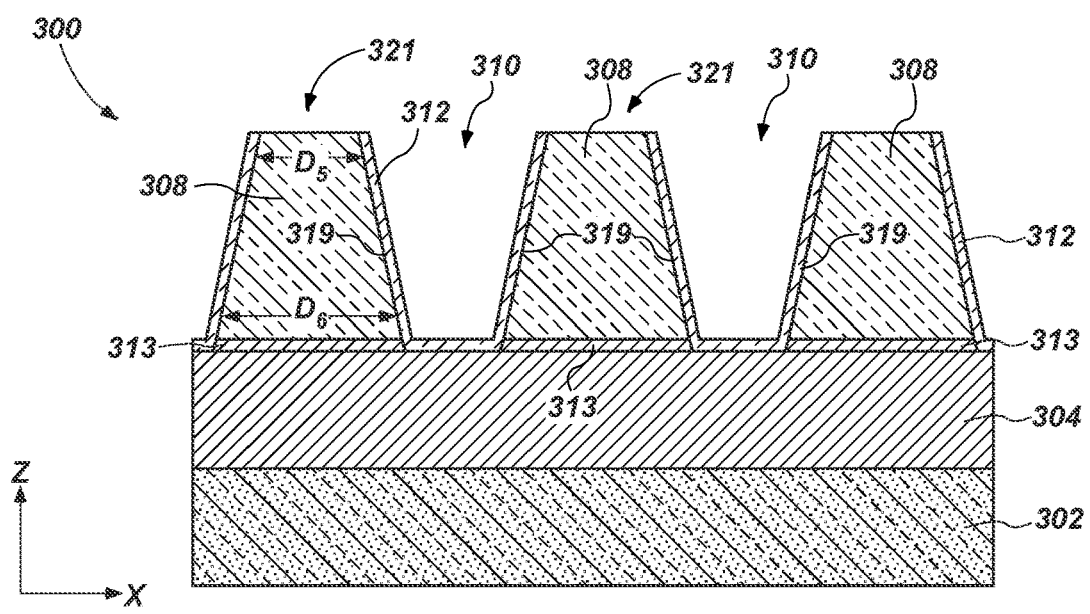

FIG. 5C is a simplified partial perspective view of the semiconductor device 300 after patterning trenches 310 in the semiconductor device 300. FIG. 5D is a simplified partial cross-sectional view of the semiconductor device 300 taken along section line D-D of FIG. 5C. The trenches 310 may separate isolated pillars 321 of the sacrificial material 308. The trenches 310 may be formed by, for example, forming a mask over the semiconductor device 300 and exposing the semiconductor device 300 through the mask to one or more etch chemistries to remove portions of the electrically insulative material 306 and portions of the sacrificial material 308 exposed through the mask. In some embodiments, the trenches 310 may extend from an upper surface of the semiconductor device 300 to a surface of the lower conductive contact material 313.

In some embodiments, forming the trenches 310 forms tapered sidewalls 319 for the sacrificial material 308. Stated another way, the isolated pillars 321 of the sacrificial material 308 may be at least partially defined by tapered sidewalls 319. The tapered sidewalls 319 may extend from the substrate 302 at an angle other than substantially perpendicular. The tapered sidewalls 319 may be angled with respect to a plane perpendicular to the major surface of the substrate 302. The angle may be within a range of from about 0° to about 20°, such as from about 0° to about 2°, from about 2° to about 50, from about 50 to about 10°, from about 10° to about 15°, or from about 15° to about 20°.

With continued reference to FIG. 5B and FIG. 5D, the isolated pillars 321 may be defined by tapered sidewalls 319 in one lateral direction (e.g., the x-direction in FIG. 5D) and defined by tapered sidewalls 309 in another lateral direction (e.g., the Y-direction in FIG. 5B). In some embodiments, the tapered sidewalls 319 define the isolated pillars 321 of the sacrificial material 308 such that the sacrificial material 308 exhibits a larger distance $D_6$ between opposing tapered sidewalls 319 at a lower portion thereof than a distance $D_5$ between opposing tapered sidewalls 319 at an upper portion thereof. Accordingly, the sacrificial material 308 may include a larger dimension between opposing sidewalls in the y-direction at an upper portion thereof than a dimension between opposing tapered sidewalls 319 in the x-direction at an upper portion thereof.

After forming the trenches 310, a gate dielectric material 312 may be formed adjacent to (e.g., over, on) surfaces of the semiconductor device 300. In some embodiments, the gate dielectric material 312 is conformally formed adjacent to (e.g., over, on) surfaces of the semiconductor device 300, and then portions of the gate dielectric material 312 located outside of the trenches 310 is removed (e.g., by way of a CMP process). As shown in FIG. 5C, the gate dielectric material 312 may extend in the y-direction within the trenches 310.

The gate dielectric material 312 may be formed to a thickness within a range of from about 5 nm to about 20 nm, such as from about 5 nm to about 10 nm or from about 10 nm to about 20 nm. In some embodiments, the thickness of the gate dielectric material 312 is about 5 nm.

The gate dielectric material 312 may include the same materials described above with reference to the gate dielectric material 122 (FIG. 1B). In some embodiments, the gate dielectric material 312 comprises silicon dioxide.

Figure 5E:
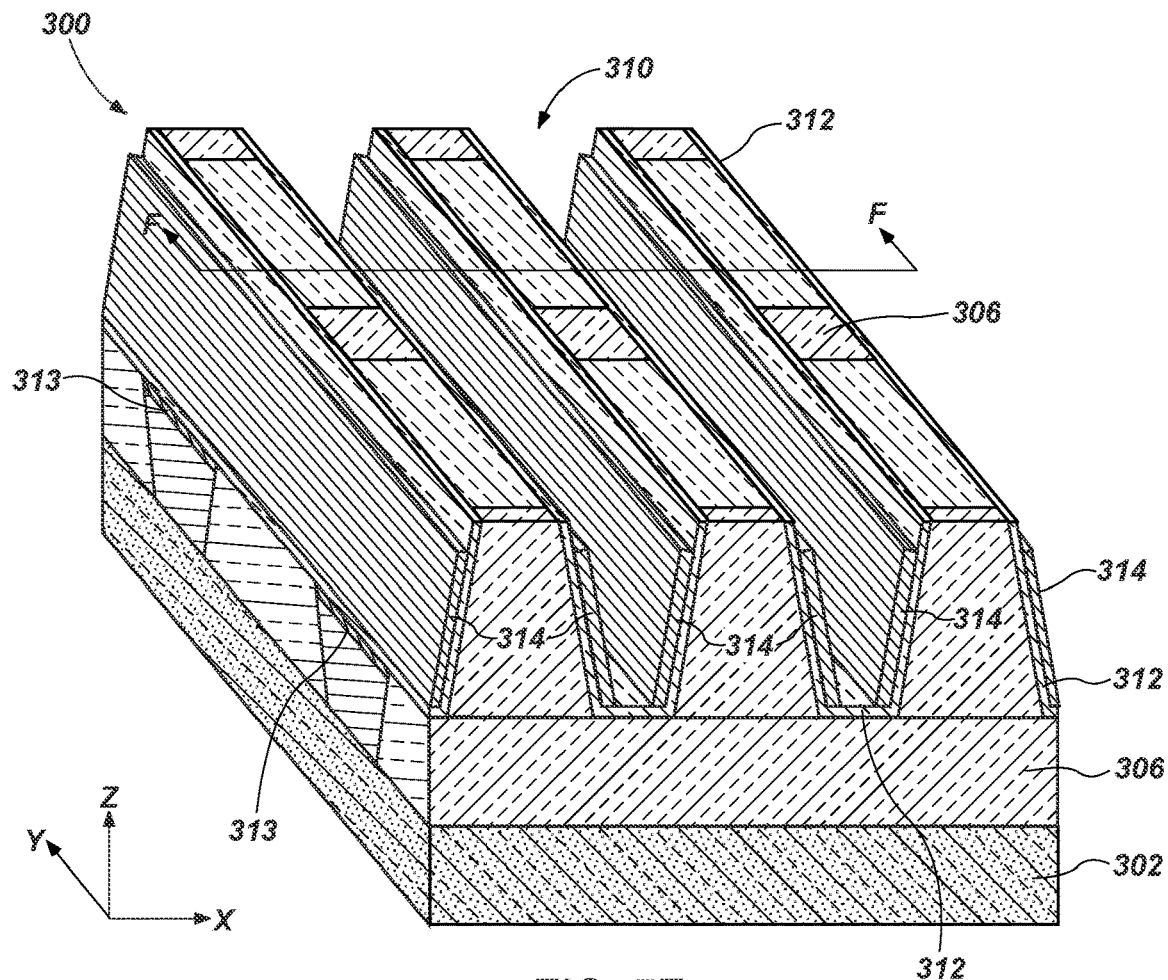
Figure 5F:
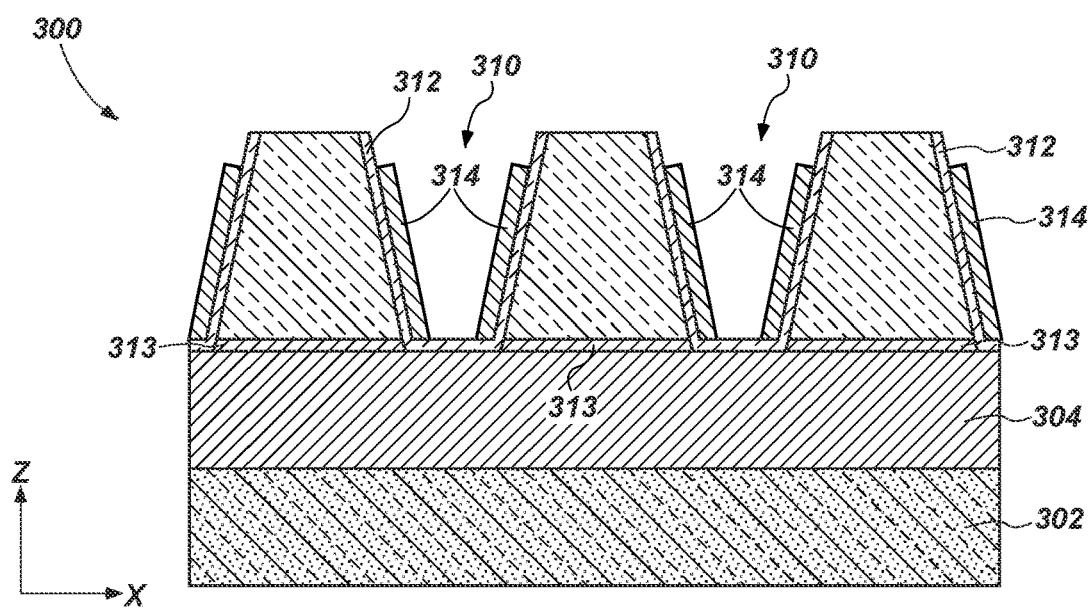

Referring to FIG. 5E, gate electrodes 314 may be formed adjacent to (e.g., over, on) portions of the gate dielectric material 312. FIG. 5F is a simplified partial cross-sectional view of the semiconductor device 300 taken along section line F-F of FIG. 5E. The gate electrodes 314 may extend in the trenches 310 in the y-direction.

The gate electrodes 314 may be formed of and include the same materials as the gate electrode 124 described above (FIG. 1A, FIG. 1B). In some embodiments, the gate electrodes 314 comprise titanium nitride.

A length of the gate electrode 314 may be about the same as the length L of the gate electrode 124 described above with reference to FIG. 1A through FIG. 1C. In some embodiments, the length of the gate electrode material 314 is within a range of from about 30 nm to about 200 nm, such as from about 30 nm to about 50 nm, from about 50 nm to about 100 nm, or from about 100 nm to about 200 nm. In some embodiments, the length L of the gate electrode material 314 is within a range of from about 60 nm to about 65 nm. A thickness of the gate electrode material 314 may be about the same as the thickness t of the gate electrode 124 described above with reference to FIG. 1A through FIG. 1C. In some embodiments, the thickness of the gate electrode material 314 is within a range of from about 5 nm to about 15 nm, such as from about 5 nm to about 10 nm, or from about 10 nm to about 15 nm.

In some embodiments, the gate electrodes 314 extend to the gate dielectric material 312 within lower portions of the trenches 310, as illustrated in FIG. 5F. In other embodiments, the gate electrodes 314 do not contact the gate dielectric material 312 at the lower portions of the trenches 310. In some such embodiments, a portion of the trenches 310 are filled with a dielectric material (e.g., a spin-on dielectric material) and the gate electrodes 314 are formed adjacent to the gate dielectric material 312 on sidewalls of the sacrificial material 308 and the electrically insulative material 306. Accordingly, lower portions of the gate electrodes 314 may not contact laterally extending portions of the gate dielectric material 312 (i.e., portions of the gate dielectric material 312 extending in the x-direction).

Figure 5G:
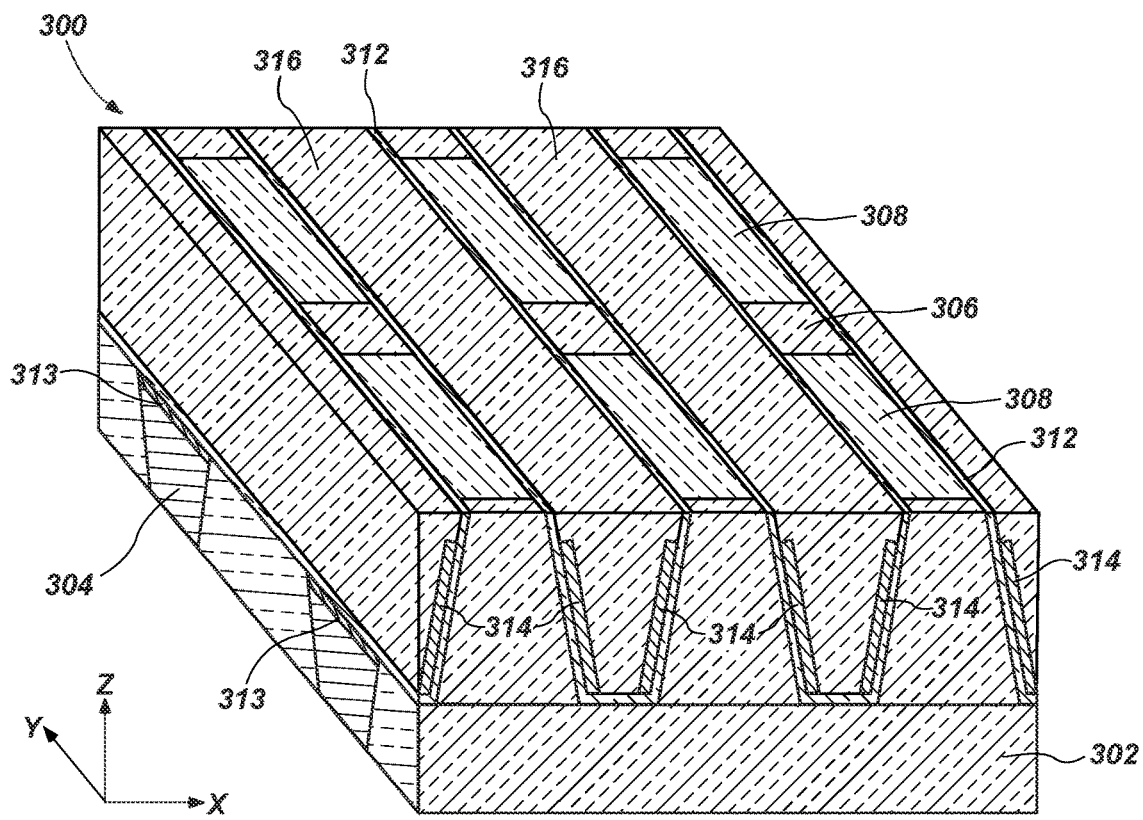

With reference to FIG. 5G, remaining (e.g., unfilled) portions of the trenches 310 (FIG. 5E, FIG. 5F) may be filled with an electrically insulative material 316. The electrically insulative material 316 may comprise the same materials described above with reference to the electrically insulative material 306. In some embodiments, the electrically insulative material 316 comprises the same material as the gate dielectric material 312. In some embodiments, the electrically insulative material 316 comprises silicon dioxide.

After forming (e.g., depositing) the electrically insulative material 316, portions of the electrically insulative material 316 on upper surfaces of the semiconductor device 300 may be removed, such as by way of a CMP process. In some embodiments, sufficient electrically insulative material 316 is removed to expose upper surfaces of the sacrificial material 308.

Figure 5H:
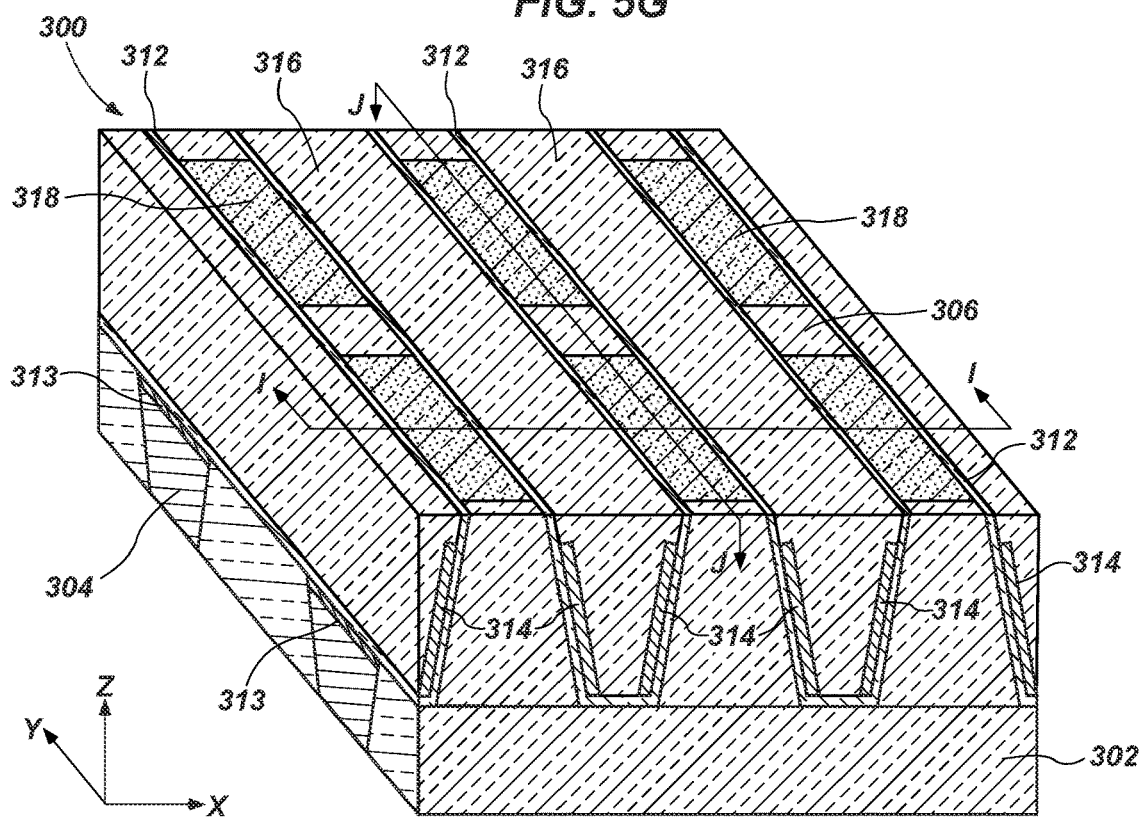
Figure 5I:
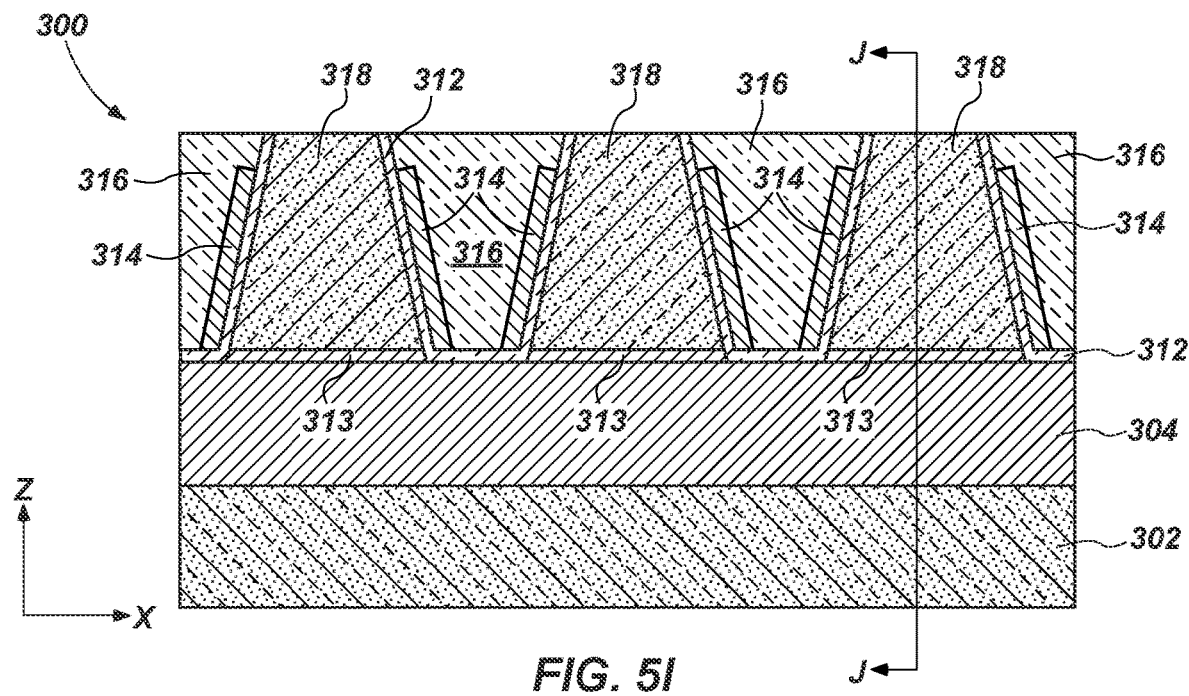
Figure 5J:
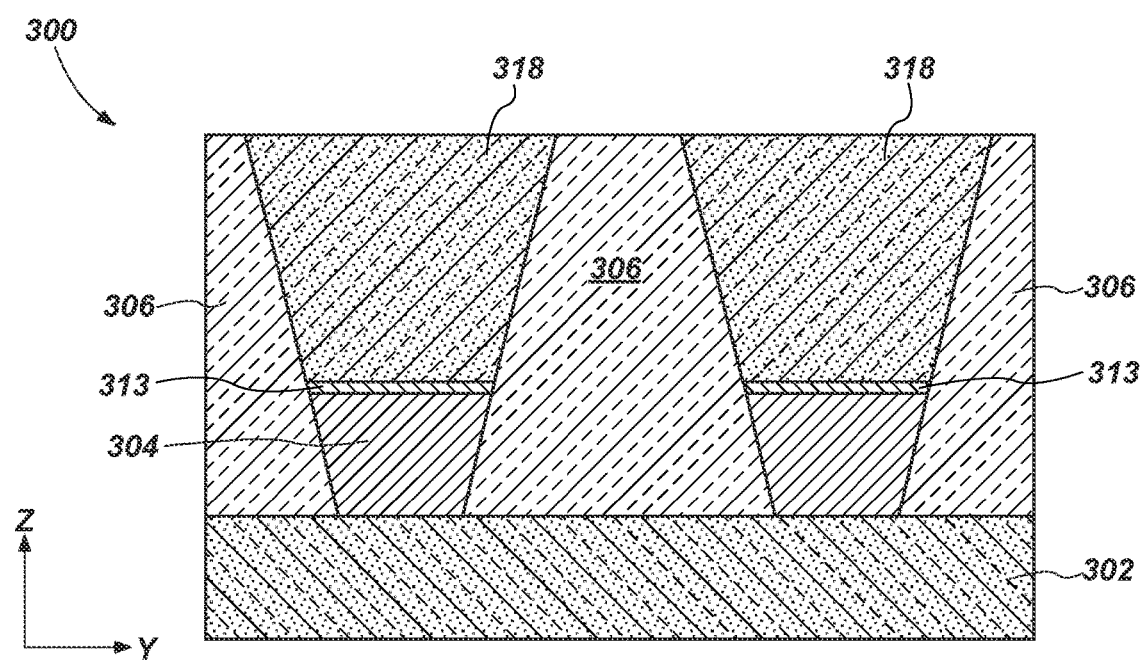

With reference to FIG. 5H, the sacrificial material 308 (FIG. 5G) may be selectively removed to form openings, which may then be filled with a semiconductor material 318. The sacrificial material 308 may be removed by exposing the sacrificial material 308 to a suitable etch chemistry to substantially remove the sacrificial material 308 without substantially removing the electrically insulative material 306. FIG. 5I is a simplified partial cross-sectional view of the semiconductor device 300 taken along section line I-I of FIG. 5H. FIG. 5J is a simplified cross-sectional view of the semiconductor device 300 taken along section line J-J of FIG. 5H.

In some embodiments, the semiconductor material 318 is formed in remaining portions of the openings through an ALD process. However, the disclosure is not so limited and the semiconductor material 318 may be formed in the openings by other methods, such as chemical vapor deposition (CVD), physical vapor deposition (PVD), low pressure chemical vapor deposition (LPCVD), plasma enhanced chemical vapor deposition (PECVD), another deposition method, or combinations thereof.

Portions of the semiconductor material 318 on upper surfaces of the semiconductor device 300 may be removed, such as by way of a CMP process. The semiconductor material 318 may comprise the same material as the semiconductor material 114 (FIG. 1A through FIG. 1C). In some embodiments, the semiconductor material 318 comprises IGZO. In additional embodiments, the semiconductor material 318 comprises a composite structure including one or more discrete portions of one or more of the materials described above.

Figure 5K:
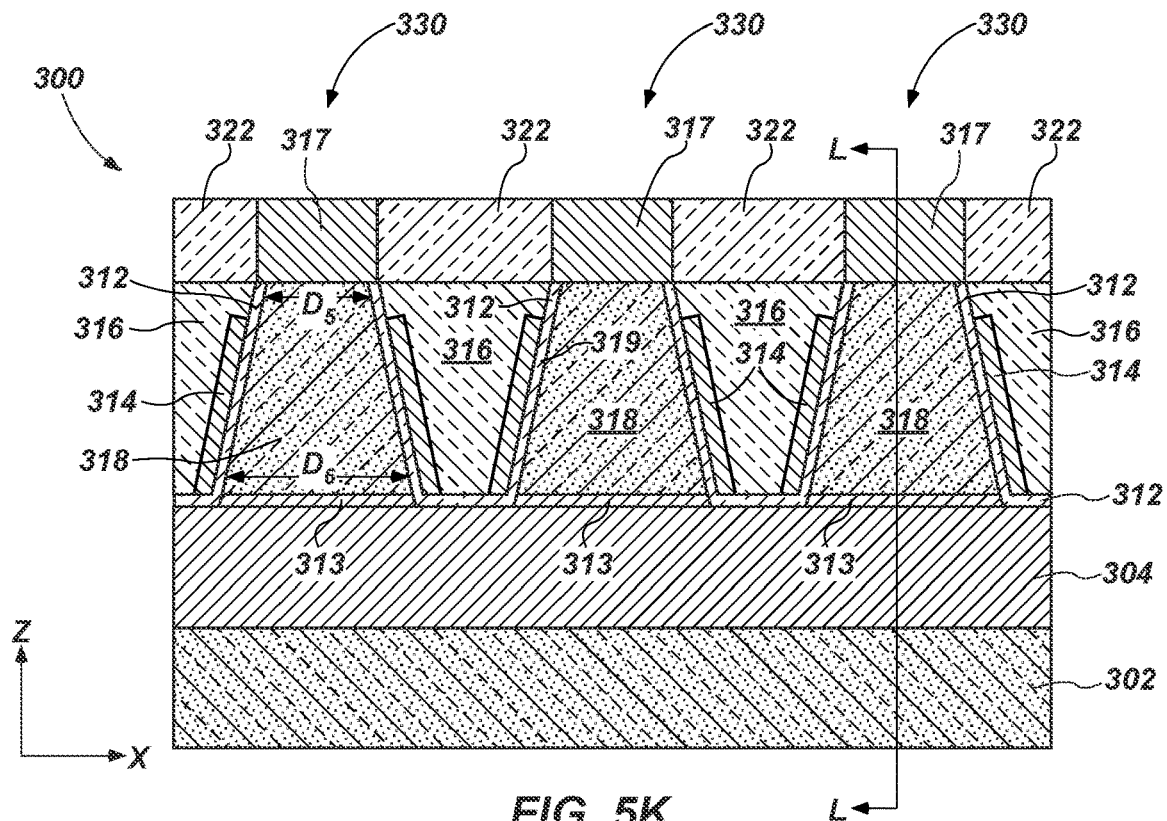
Figure 5L:
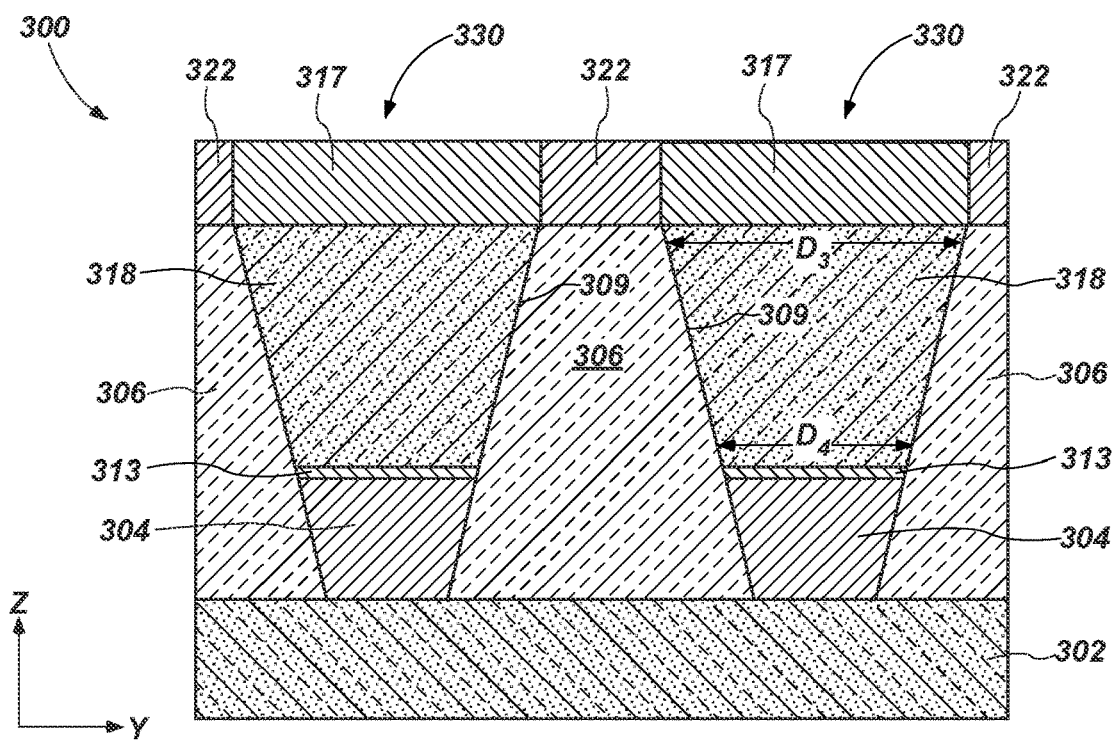

With reference to FIG. 5K and FIG. 5L, after planarizing surfaces of the semiconductor device 300, an upper conductive contact material 317 may be formed over the semiconductor material 318. An electrically insulative material 322 may electrically isolate the upper conductive contact material 317 of transistor structures 330. The electrically insulative material 322 may be the same material as the electrically insulative materials 306, 316.

With continued reference to FIG. 5K and FIG. 5L, the semiconductor material 318 may form a channel region of transistor structures 330. The transistor structures 330 may each individually comprise a source region (e.g., the electrically conductive material 304), a channel region (e.g., the semiconductor material 318), the upper conductive contact material 317, which may be in electrical communication with a drain region, a gate dielectric material (e.g., the gate dielectric material 312), and at least one (e.g., one, two) gate electrode (e.g., the gate electrode 314).

As described above, since the opposing tapered sidewalls 309 (FIG. 5B) are tapered, the distance $D_3$ between opposing tapered sidewalls 309 of the semiconductor material 318 may be larger at an upper portion thereof than the distance $D_4$ between the opposing tapered sidewalls 309 at a lower portion of the semiconductor material 318 in a first cross-section (e.g., the cross-sectional view of FIG. 5L). In a second cross-section (e.g., the cross-sectional view of FIG. 5K) the distance $D_5$ between the opposing tapered sidewalls 319 of the semiconductor material 318 may be smaller at an upper portion than a distance $D_6$ between the opposing tapered sidewalls 319 of the semiconductor material 318 at a lower portion thereof in a second cross-section (e.g., the cross-sectional view of FIG. 5K). Accordingly, dimensions between opposing sidewalls at an upper portion of the semiconductor material 318 may be greater in a first direction (e.g., the y-direction) than in a second direction (e.g., the x-direction). In some such embodiments, the semiconductor material 318 may include tapered sidewalls in the first direction and the second direction, the taper (e.g., angle) being different in the first direction and the second direction.

Since the distance $D_3$ is larger than the distance $D_4$ between the opposing tapered sidewalls 309, the semiconductor material 318 may substantially fill the openings left after removal of the sacrificial material 308 without pinching off (e.g., closing the top portion of the opening prior to substantially completely filling the opening with the semiconductor material 318).

Thus, in accordance with embodiments of the disclosure, a semiconductor device including vertical thin film transistors may be formed by a damascene process. A sacrificial material is formed in trenches having a wider opening at upper portions thereof than at lower portions thereof. The sacrificial material is removed and the channel material is disposed therein. The channel material may substantially fill the openings without pinching off since the openings after removal of the sacrificial material exhibits a greater width at the upper portion thereof than the lower portion thereof in the first direction.

Accordingly, in at least some embodiments, a method of forming a semiconductor device comprises forming first trenches in an electrically insulative material, forming a sacrificial material within the first trenches, forming second trenches in the electrically insulative material and the sacrificial material, the second trenches laterally extending in a different direction than the first trenches, forming a gate dielectric material within the second trenches, forming a gate electrode material adjacent to at least a portion of the gate dielectric material, filling remaining portions of the second trenches with an electrically insulative material, removing remaining portions of the sacrificial material to form openings, and forming an oxide semiconductor material within the openings.

Accordingly, in some embodiments, a semiconductor device comprises at least one pillar comprising at least one oxide semiconductor material, the at least one pillar wider in a first lateral direction at an upper portion thereof than at a lower portion thereof, a gate dielectric material adjacent to sidewalls of the at least one pillar and extending in the first lateral direction, and at least one gate electrode adjacent to at least a portion of the gate dielectric material.

Accordingly, in some embodiments, a method of forming a semiconductor device comprises forming a gate dielectric material adjacent to a sacrificial material, forming a gate electrode over material adjacent to the gate dielectric material, removing the sacrificial material to form an opening, and forming a composite structure comprising oxide semiconductor materials in the opening. Forming the composite structure comprises forming at least a first oxide semiconductor material within at least a portion of the opening and forming at least a second oxide semiconductor material adjacent to the first oxide semiconductor material within the opening.

Figure 6:
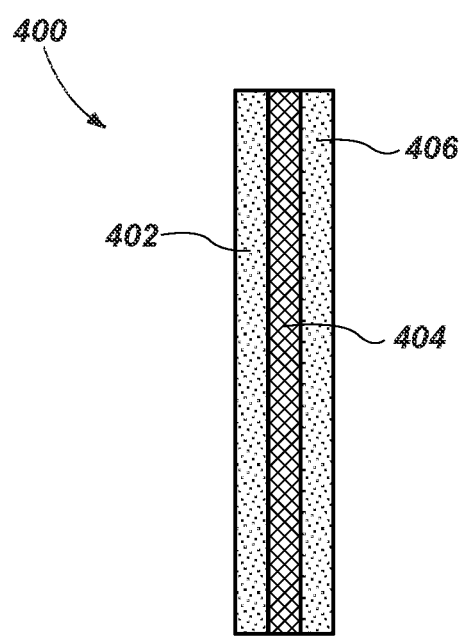
FIG. 6 is a simplified partial cross-sectional view of a semiconductor structure, in accordance with embodiments of the disclosure.
Figure 7:
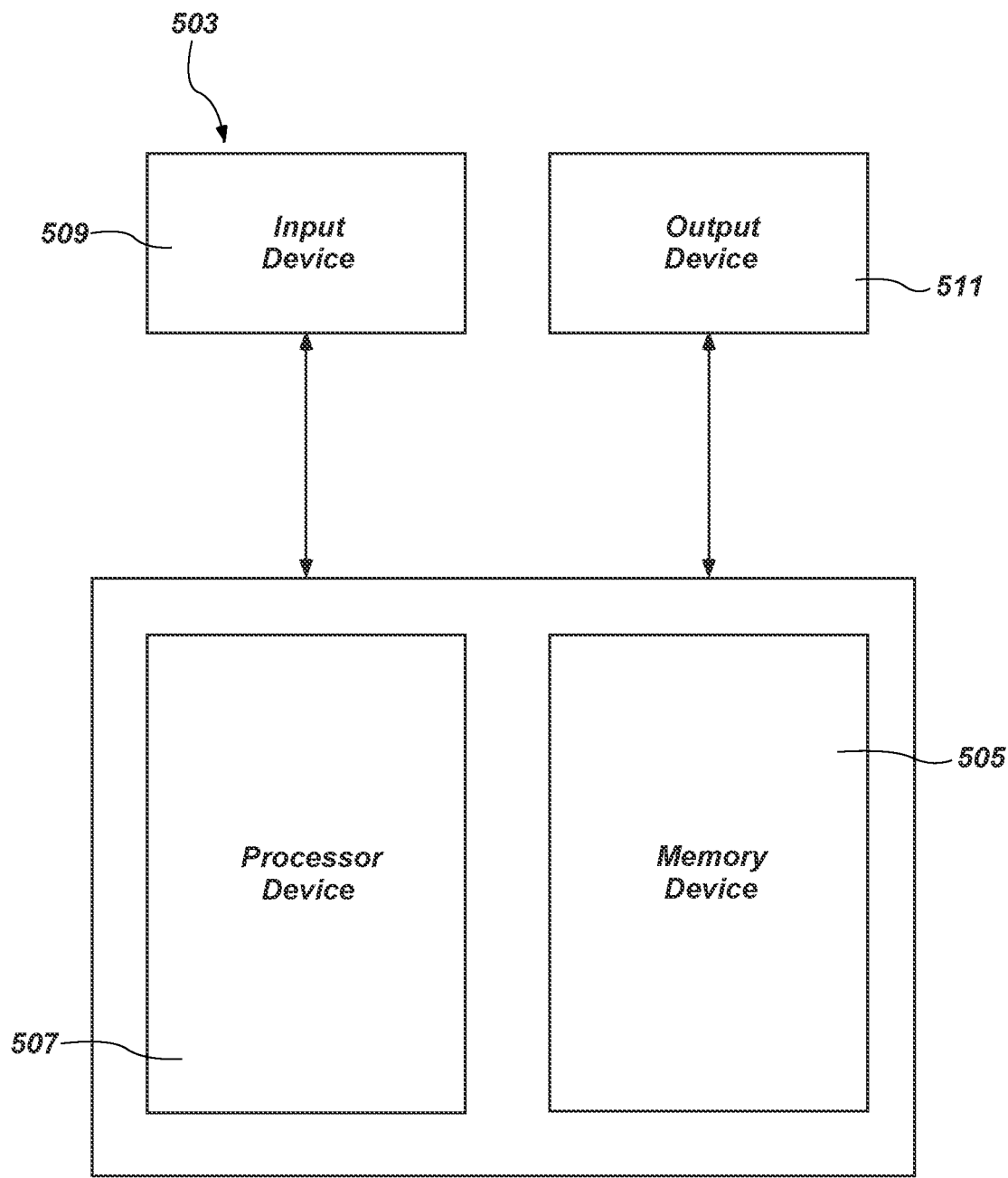
FIG. 7 is a schematic block diagram of an electronic system, in accordance with an embodiment of the disclosure.

As previously discussed, in some embodiments, one or more of the semiconductor materials 114, 230, 318 comprises a composite structure including at least one semiconductor material different from at least another semiconductor material of the composite structure. FIG. 6 is a simplified partial cross-sectional view of a semiconductor structure 400 that may be used as one or more of the semiconductor materials 114, 230, 318 described above. The semiconductor structure 400 may, for example, comprise a channel region of a vertical transistor (e.g., one or more of the vertical transistors 110, 110', 110", 330). The semiconductor structure 400 includes a first semiconductor material 402, a second semiconductor material 404 on the first semiconductor material 402, and a third semiconductor material 406 on the second semiconductor material 404. The second semiconductor material 404 may intervene between the first semiconductor material 402 and the third semiconductor material 406.

The first semiconductor material 402, the second semiconductor material 404, and the third semiconductor material 406 may each individually comprise zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), or combinations thereof.

In some embodiments, the first semiconductor material 402 and the third semiconductor material 406 comprise the same material. In other embodiments, each of the first semiconductor material 402, the second semiconductor material 404, and the third semiconductor material 406 comprise different materials. In additional embodiments, the first semiconductor material 402 and the third semiconductor material 406 each comprises IGSO, and the second semiconductor material 404 comprises IGZO. Accordingly, the semiconductor structure 400 may comprise an IGSO/IGZO/IGSO composite structure. In some embodiments, the semiconductor structure 400 comprises the first semiconductor material 402 and the second semiconductor material 404. The first semiconductor material 402 and the second semiconductor material 404 may comprise IGZO but may have a different composition. For example, the first semiconductor material 402 may exhibit a different atomic percent of one or more of indium, gallium, and zirconium than the second semiconductor material 404. Stated another way, the second semiconductor material 404 may comprise the same elements as the first semiconductor material 402 but may exhibit a different stoichiometry (and composition) than the first semiconductor material 402.

Forming one or more of the semiconductor materials 114, 230, 318 as a composite structure may facilitate formation of channel regions exhibiting one or more desired properties, such as, for example, hydrogen tolerance. As one example, a semiconductor structure 400 comprising an IGSO/IGZO/IGSO composite structure may exhibit tolerance to hydrogen and reduce or prevent diffusion of hydrogen into the composite structure, which hydrogen may negatively affect the electrical properties of the semiconductor structure 400. In some embodiments, forming the semiconductor structure 400 from multiple semiconductor materials may facilitate forming the semiconductor structures 400 exhibiting a desired threshold voltage ($V_t$). In other words, the threshold voltage of the semiconductor structures 400 (and, hence, of channel materials of the corresponding vertical transistors) may be controlled by forming the semiconductor structures 400 to comprise one or more semiconductor materials. In some embodiments, the semiconductor structures 400 may comprise a quantum well exhibiting reduced scattering at an interface of the gate oxide material and the semiconductor material of the semiconductor structure 400 by selection of appropriate semiconductor materials. In some such embodiments, vertical transistors formed with the semiconductor structures 400 may exhibit a reduced amount of leakage compared to conventional channel materials. Accordingly, the semiconductor structures 400 may exhibit increased electron carrier mobility, a lower off current, and a higher threshold voltage than conventional channel materials of vertical transistors.

Accordingly, semiconductor devices (e.g., the semiconductor devices 100, 100', 100", 200, 300) of the disclosure may be formed with pristine channel regions (e.g., channel regions formed without etching the semiconductor material thereof). The semiconductor materials (e.g., the semiconductor materials 114, 230, 318) of the disclosure may exhibit improved properties relative to conventional semiconductor materials of conventional vertical transistors. For example, the semiconductor materials of the disclosure may exhibit a higher threshold voltage, a reduced off current, and a greater electron carrier mobility compared to conventional semiconductor materials. The semiconductor materials of the disclosure may be free of substantial voids or gaps defined therein, since the semiconductor materials are formed in openings having a larger dimension between an upper portion of opposing sidewalls in at least one direction.

Semiconductor devices (e.g., the semiconductor devices 100, 100', 100", 200, 300) including the semiconductor materials (e.g., the semiconductor materials 114, 230, 318) in accordance with embodiments of the disclosure may be used in embodiments of electronic systems of the disclosure. For example, FIG. 5 is a block diagram of an illustrative electronic system 503 according to embodiments of disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment of a semiconductor device previously described herein (e.g., semiconductor devices 100, 100', 100", 200, 300), wherein channel regions (e.g., the semiconductor materials 114, 230, 318) comprise pristine as-deposited materials. The channel regions may include substantially perpendicular sidewalls. In other embodiments, the channel regions may have a larger dimension between opposing sidewalls at an upper portion thereof than at a lower portion thereof in at least one direction.

The electronic system 503 may further include at least one electronic signal processor device 507 (often referred to as a "microprocessor"). The electronic signal processor device 507 may, optionally, include an embodiment of a semiconductor device previously described herein (e.g., the semiconductor devices 100, 100', 100", 200, 300). The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output) to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507.

Thus, in accordance with embodiments of the disclosure, an electronic system comprises at least one input device, at least one output device, at least one processor device operably coupled to the at least one input device and the at least one output device, and a semiconductor device operably coupled to the at least one processor device. The semiconductor device comprises pillars each comprising at least one oxide semiconductor material, the pillars wider at an upper portion thereof than at a lower portion thereof, a gate dielectric material adjacent to sidewalls of each pillar, the gate dielectric material extending in a direction of the wider upper portion thereof, and at least one gate electrode adjacent to at least a portion of the gate dielectric material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
vertically oriented pillars each comprising at least one oxide semiconductor material, at least one of the vertically oriented pillars wider in a first lateral direction at a lower portion thereof than at an upper portion thereof and wider in a second lateral direction at the upper portion thereof than at the lower portion thereof;
electrically conductive lines vertically underlying the vertically oriented pillars and extending in the first lateral direction;
gate dielectric material adjacent sidewalls of the vertically oriented pillars and upper surfaces of the electrically conductive lines; and
gate electrodes horizontally adjacent the gate dielectric material.

2. The device of claim 1, wherein the gate electrodes extend in the second lateral direction.

3. The device of claim 1, wherein the at least one oxide semiconductor material comprises a composite semiconductor material comprising at least two oxide semiconductor materials.

4. The device of claim 1, wherein the at least one oxide semiconductor material comprises three oxide semiconductor materials.

5. The device of claim 1, wherein the at least one oxide semiconductor material comprises:
a first oxide semiconductor material;
a second oxide semiconductor material; and
a third oxide semiconductor material comprising substantially the same material composition as the first oxide semiconductor material, the second oxide semiconductor material horizontally between the first oxide semiconductor material and the third oxide semiconductor material.

6. The device of claim 1, wherein the at least one oxide semiconductor material comprises:
a first oxide semiconductor material; and
a second oxide semiconductor material neighboring the first oxide semiconductor material and comprising the same elements as the first oxide semiconductor material, the second oxide semiconductor material comprising a different atomic percent of one or more elements than the first oxide semiconductor material.

7. The device of claim 1, wherein the at least one oxide semiconductor material comprises an unetched oxide semiconductor material.

8. The device of claim 1, wherein an angle of the sidewalls of the vertically oriented pillars is different in the first lateral direction than in the second lateral direction.

9. The device of claim 1, wherein the sidewalls of the vertically oriented pillars are oriented at an angle of from about 2° to about 5°.

10. The device of claim 1, wherein a thickness of the gate electrodes is within a range of from about 5 nm to about 15 nm.

11. A method of forming a device, the method comprising:
forming, on sidewalls of a sacrificial material, a gate dielectric material extending in a first lateral direction, the sacrificial material wider in the first lateral direction at a lower portion of the sacrificial material than at an upper portion of the sacrificial material;
forming a gate electrode on sidewalls of the gate dielectric material; and
replacing the sacrificial material with an oxide semiconductor material to form an oxide semiconductor material wider in the first lateral direction at a lower portion thereof than at an upper portion thereof and wider in a second lateral direction at the upper portion thereof than at the lower portion thereof.

12. The method of claim 11, further comprising forming the sacrificial material to comprise silicon, a carbon-containing material, polysilicon, or silicon nitride.

13. The method of claim 11, wherein replacing the sacrificial material with an oxide semiconductor material comprises:
selectively removing the sacrificial material to form openings; and
forming the oxide semiconductor material by atomic layer deposition to fill the openings with the oxide semiconductor material.

14. The method of claim 11, wherein replacing the sacrificial material with an oxide semiconductor material comprises forming an oxide semiconductor material comprising a composite structure.

15. The method of claim 11, wherein replacing the sacrificial material with an oxide semiconductor material comprises forming an oxide semiconductor material comprising a second oxide semiconductor material disposed between a first oxide semiconductor material and a third oxide semiconductor material comprising substantially the same material composition as the first oxide semiconductor material.

16. The method of claim 11, wherein forming an oxide semiconductor material comprises forming the oxide semiconductor material to have a vertical height larger than a vertical height of the gate electrode.

17. A device, comprising:
a vertically oriented pillar comprising:
an unetched composite oxide semiconductor material comprising:
a first oxide semiconductor material; and
a second oxide semiconductor material neighboring the first oxide semiconductor material and having a different material composition than the first oxide semiconductor material;
wherein a lower portion of the unetched composite oxide semiconductor material has a greater width than an upper portion thereof in a first lateral direction; and
wherein the upper portion of the unetched composite oxide semiconductor material has a greater width than the lower portion thereof in a second lateral direction;
a gate dielectric material on sidewalls of the vertically oriented pillar; and
a gate electrode on at least a portion of the gate dielectric material.

18. The device of claim 17, wherein the unetched composite oxide semiconductor material further comprises a third oxide semiconductor material neighboring the second oxide semiconductor material on a side of the second oxide semiconductor material opposite the first oxide semiconductor material.

19. The device of claim 17, wherein an upper surface of the unetched composite oxide semiconductor material extends vertically higher than an upper surface of the gate electrode a distance within a range of from about 5 nm to about 10 nm.

* * * * *

UNITED STATES PATENT AND TRADEMARK OFFICE
CERTIFICATE OF CORRECTION

PATENT NO. : 11,973,145 B2
APPLICATION NO. : 17/806427
DATED : April 30, 2024
INVENTOR(S) : Durai Vishak Nirmal Ramaswamy and Scott E. Sills It is certified that error appears in the above-identified patent and that said Letters Patent is hereby corrected as shown below:

In the Specification

Column 7, Line 59, change "(Al$_x$Sn$_y$In$_z$Zn$_z$O$_d$), silicon" to --(Al$_x$Sn$_y$In$_z$Zn$_a$O$_d$), silicon--
Column 15, Lines 4-5, change "about 50, from about 50 to" to --about 5°, from about 5° to--
Column 15, Line 44, change "about 50, from about 50 to" to --about 5°, from about 5° to--

Signed and Sealed this
Third Day of December, 2024

Katherine Kelly Vidal
*Director of the United States Patent and Trademark Office*